US012707919B2

(12) United States Patent
Hayashi et al.

(10) Patent No.: US 12,707,919 B2
(45) Date of Patent: Aug. 11, 2026

(54) BONDING APPARATUS AND BONDING METHOD

(71) Applicant: Tokyo Electron Limited, Tokyo (JP)

(72) Inventors: Tokutarou Hayashi, Kikuchi gun (JP); Yoshitaka Otsuka, Koshi (JP); Yasutaka Mizomoto, Kikuchi-gun (JP); Kazuya Ikeue, Kikuchi-gun (JP); Munehisa Kodama, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 716 days.

(21) Appl. No.: 17/759,517

(22) PCT Filed: Jan. 21, 2021

(86) PCT No.: PCT/JP2021/002053
§ 371 (c)(1),
(2) Date: Jul. 27, 2022

(87) PCT Pub. No.: WO2021/153416
PCT Pub. Date: Aug. 5, 2021

(65) Prior Publication Data

US 2023/0086738 A1 Mar. 23, 2023

(30) Foreign Application Priority Data

Jan. 28, 2020 (JP) ................................ 2020-011926

(51) Int. Cl.
*B32B 41/00* (2006.01)
*H10P 72/00* (2026.01)
(Continued)

(52) U.S. Cl.
CPC ...... *H10P 72/0604* (2026.01); *H10P 72/0428* (2026.01); *H10P 72/50* (2026.01); *H10P 74/203* (2026.01)

(58) Field of Classification Search
CPC ......... H01L 21/67253; H01L 21/67092; H01L 21/68; H01L 22/12; H01L 21/67219;
(Continued)

(56) References Cited

U.S. PATENT DOCUMENTS

2016/0172254 A1* 6/2016 Wimplinger ............ G01B 7/06 356/630
2018/0308770 A1* 10/2018 Sugaya ............ H01L 21/68764
2020/0027768 A1* 1/2020 Zinner .................... H01L 21/68

FOREIGN PATENT DOCUMENTS

JP 2013-062431 A 4/2013
JP 5434910 B2 3/2014
(Continued)

OTHER PUBLICATIONS

International Search Report of PCT/JP2021/002053 dated Apr. 13, 2021.

*Primary Examiner* — Michael N Orlando
*Assistant Examiner* — Joshel Rivera
(74) *Attorney, Agent, or Firm* — Shih IP Law Group, PLLC.

(57) ABSTRACT

A bonding apparatus is configured to bond a first substrate and a second substrate to prepare a combined substrate. The first substrate includes a base substrate, and a device layer formed on a surface of the base substrate facing the second substrate. The bonding apparatus includes a first holder configured to hold the first substrate; a second holder configured to hold the second substrate; a moving unit configured to move the first holder and the second holder relative to each other; and a total thickness measurement controller configured to control a thickness detector, which is configured to measure a total thickness of the combined substrate, to measure the total thickness at multiple points.

22 Claims, 24 Drawing Sheets

(51) Int. Cl.
*H10P 72/50* (2026.01)
*H10P 74/20* (2026.01)

(58) Field of Classification Search
CPC ..... H01L 21/02; H01L 21/304; H01L 21/681; H01L 21/185; H01L 21/6838; H01L 21/68764; B24B 37/042; B24B 37/10; G01B 11/06
USPC .................... 156/60, 64, 350, 351, 378, 379
See application file for complete search history.

(56) References Cited

FOREIGN PATENT DOCUMENTS

| | | | |
|---|---|---|---|
| JP | 2014-226749 | A | 12/2014 |
| KR | 10-2013-0139251 | A | 12/2013 |

* cited by examiner 152
151
141
110
W1
M1c
M1b
M1a
143
M2c
M2b
M2a
W2
120
142
Z
X
Y 152
151
141
110
W1
M1c
M1b
M1a
M2c
M2b
M2a
W2
120
142
Z
X
Y 152
151
141
M1c
M1b
110
M1a
W1
W2
142
120
M2c
M2b
M2a
Z
X
Y

BONDING APPARATUS AND BONDING METHOD

CROSS-REFERENCE TO RELATED APPLICATIONS

This Application is a U.S. national phase application under 35 U.S.C. § 371 of PCT Application No. PCT/JP2021/002053 filed on Jan. 21, 2021, which claims the benefit of Japanese Patent Application No. 2020-011926 filed on Jan. 28, 2020, the entire disclosures of which are incorporated herein by reference.

TECHNICAL FIELD

The various aspects and embodiments described herein pertain generally to a bonding apparatus and a bonding method.

BACKGROUND

Patent Document 1 describes a method of grinding an upper plate-shaped workpiece attached to a lower plate-shaped workpiece. This method includes measuring a thickness of the lower plate-shaped workpiece at three measurement positions at least in the state that a bottom surface of the lower plate-shaped workpiece is held by a holding table, adjusting the parallelism between a top surface of the lower plate-shaped workpiece and a bottom surface of a grinding whetstone based on the measurement results, and grinding the upper plate-shaped workpiece after adjusting the parallelism.

PRIOR ART DOCUMENT

Patent Document 1: Japanese Patent Laid-open Publication No. 2014-226749

DISCLOSURE OF THE INVENTION

Means for Solving the Problems

In an exemplary embodiment, a bonding apparatus is configured to bond a first substrate and a second substrate to prepare a combined substrate. The first substrate includes a base substrate, and a device layer formed on a surface of the base substrate facing the second substrate. The bonding apparatus includes a first holder configured to hold the first substrate; a second holder configured to hold the second substrate; a moving unit configured to move the first holder and the second holder relative to each other; and a total thickness measurement controller configured to control a thickness detector, which is configured to measure a total thickness of the combined substrate, to measure the total thickness at multiple points.

BRIEF DESCRIPTION OF THE DRAWINGS

FIG. 8A is a side view illustrating an example of height measurement of a top surface of a second holder, and FIG. 8B is a side view illustrating an example of height measurement of a top surface of the combined substrate.

FIG. 9A is a side view illustrating a modification example of the height measurement of the top surface of the second holder, and FIG. 9B is a side view illustrating a modification example of the height measurement of the top surface of the combined substrate.

FIG. 16 is a side view illustrating an example of an inclination angle adjusting unit of the grinding apparatus.

FIG. 17A is a side view illustrating an example of an inclination angle when a residual thickness is uniform in a diametrical direction of the combined substrate, FIG. 17B is a side view illustrating an example of the inclination angle when the residual thickness increases as it goes from a center of the combined substrate toward a periphery thereof, and FIG. 17C is a side view illustrating an example of the inclination angle when the residual thickness decreases as it goes from the center of the combined substrate toward the periphery thereof.

DETAILED DESCRIPTION

Figure 1A:
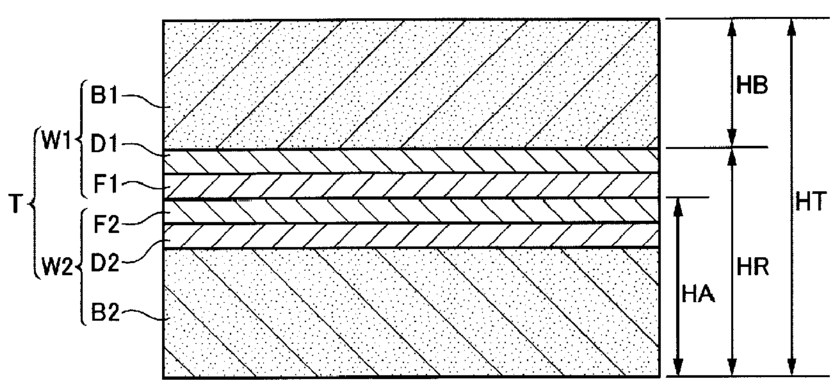
FIG. 1A is a cross sectional view illustrating an example of a combined substrate before grinding.

Hereinafter, exemplary embodiments will be described with reference to the accompanying drawings. Further, in the various drawings, same or corresponding parts will be assigned same reference numerals, and redundant description thereof will be omitted. In the present specification, the X-axis direction, the Y-axis direction and the Z-axis direction are orthogonal to each other. The X-axis direction and the Y-axis direction are horizontal directions, and the Z-axis direction is a vertical direction.

Figure 1B:
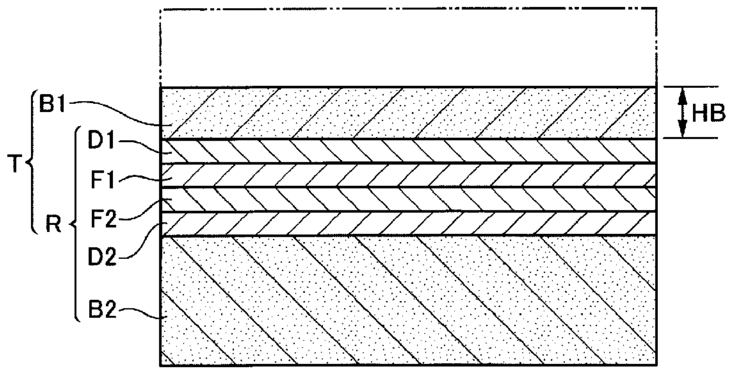
FIG. 1B is a cross sectional view illustrating an example of the combined substrate after the grinding.

There is developed a technique in which a first substrate W1 and a second substrate W2 are bonded to form a combined substrate T as shown in FIG. 1A, and, then, a base substrate 131 of the first substrate W1 is ground to be thinned as shown in FIG. 1B.

As illustrated in FIG. 1A, the first substrate W1 includes the base substrate 131 to be ground, and a device layer D1 formed on a surface of the base substrate 131 facing the second substrate W2. The base substrate 131 is, for example, a semiconductor substrate such as a silicon wafer or a compound semiconductor wafer, or a glass substrate. The device layer D1 includes an electronic circuit or the like, and includes a metal layer.

The first substrate W1 may further include a bonding layer F1 formed on a surface of the device layer D1 facing the second substrate W2. The bonding layer F1 is formed of $SiO_2$, SiC, SiCN, an adhesive, or the like. The $SiO_2$ is formed by using, for example, TEOS (tetraethoxy silane).

Meanwhile, the second substrate W2 includes a base substrate B2, and a device layer D2 formed on a surface of the base substrate B2 facing the first substrate W1. The base substrate B2 is, for example, a semiconductor substrate such as a silicon wafer or a compound semiconductor wafer, or a glass substrate. The device layer D2 includes an electronic circuit or the like, and includes a metal layer.

The second substrate W2 may further include a bonding layer F2 formed on a surface of the device layer D2 facing the first substrate W1. The bonding layer F2 is formed of $SiO_2$, SiC, SiCN, an adhesive, or the like. The $SiO_2$ is formed by using, for example, TEOS (tetraethoxy silane).

Further, the second substrate W2 may not include the device layer D2, and in this case, the bonding layer F2 is formed on a surface of the base substrate B2 facing the first substrate W1. The bonding layers F1 and F2 are provided as required, and may be omitted. If the surface of the device layer D1 is activated, the first substrate W1 and the second substrate W2 can be bonded even without the bonding layers F1 and F2.

A total thickness HT of the combined substrate T is equal to the sum of a thickness HB of the base substrate B1 of the first substrate W1 and a thickness HR of a remainder R of the combined substrate T except the base substrate B1. Hereinafter, the thickness HB of the base substrate B1 is also referred to as a base thickness HB. Further, the thickness HR of the remainder R is also called a residual thickness HR.

The residual thickness HR tends to be uniform in a circumferential direction of the combined substrate T and non-uniform in a diametrical direction of the combined substrate T. For example, as shown in FIG. 2A, the residual thickness HR gradually decreases as it goes from a center of the combined substrate T toward a periphery thereof.

Further, the residual thickness HR may gradually increase as it goes from the center of the combined substrate T toward the periphery thereof. In addition, the residual thickness HR may gradually decrease or increase in a range from both the center and the periphery of the combined substrate T to a midway point therebetween.

Figure 2A:
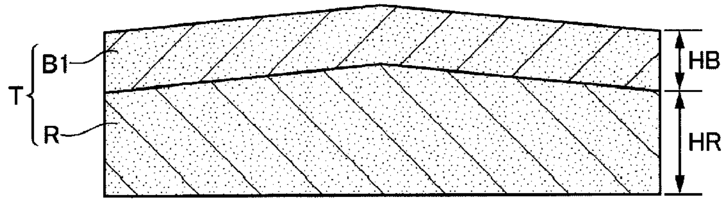
FIG. 2A is a cross sectional view showing an example of a base thickness and a residual thickness before grinding.
Figure 2B:
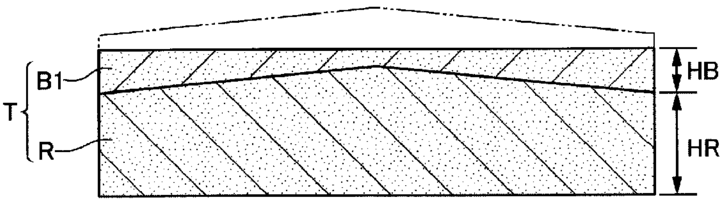
FIG. 2B is a cross sectional view showing an example of a base thickness and a residual thickness after the grinding.

When the residual thickness HR of the combined substrate T is non-uniform as shown in FIG. 2A, if a top surface of the combined substrate T is ground to be parallel to a bottom surface of the combined substrate T as shown in FIG. 2B, a variation (TTV: Total Thickness Variation) of the base thickness HB becomes large. In order to grind the base substrate B1 such that the variation in the base thickness HB after the grinding may become as small as possible, the residual thickness HR needs to be measured at multiple points.

However, as a way to measure the residual thickness HR, a method of radiating light from above the combined substrate T and measuring a phase difference between the light reflected from a top surface of the remainder R and the light reflected from a bottom surface of the remainder R cannot be used. It is because the light, such as an infrared ray, used for the measurement of the phase difference cannot penetrate the device layer D1 including the metal layer. This is also the same when the light is radiated from below the combined substrate T.

Therefore, in the present embodiment, as a way to measure the residual thickness HR, a method of measuring the total thickness HT and the base thickness HB and calculating a difference (HT−HB=HR) between the total thickness HT and the base thickness HB is employed. Even when the combined substrate T includes the device layer D1, the residual thickness HR can still be measured, and the base substrate B1 can be ground such that the variation in the base thickness HB after the grinding becomes as small as possible.

As described above, when using the method of calculating the difference (HT−HB=HR) between the total thickness HT and the base thickness HB as the way to measure the residual thickness HR, if both the HT and the HB are measured at the same points within the surface of the combined substrate T, the HR can be calculated with higher accuracy, as compared to a case where the HT and the HB are measured at different points within the surface of the combined substrate T. It is because, as stated above, the HR differs depending on a location.

When both the total thickness HT and the base thickness HB are measured at the same point, a distribution of the residual thickness HR can be calculated with high accuracy. For the purpose, position determination accuracy of the points where the total thickness HT is to be measured is important. The position determination accuracy is decided by a relative position control between a holder configured to hold the combined substrate T and a thickness detector configured to measure the total thickness HT.

Thus, in the present exemplary embodiment, the total thickness HT is measured in a bonding apparatus 100. In the bonding apparatus 100, position control with higher accuracy is required, as compared to a grinding apparatus 200. It is because the bonding apparatus 100 performs alignment between the first substrate W1 and the second substrate W2 before bonding the first substrate W1 and the second substrate W2.

Since the bonding apparatus 100 requires the high-accuracy position control as compared to the grinding apparatus

200, it has, in a moving unit 130 (see FIG. 4) or the like, a motor having high responsiveness to a position instruction as well as high position resolution. Instead of or in addition to such a high-performance motor, a device configured to absorb a vibration may be mounted to the bonding apparatus 100 in some cases.

In the present exemplary embodiment, since the total thickness HT is measured in the bonding apparatus 100, it is possible to improve the accuracy in the position determination of the points where the total thickness HT is to be measured, as compared to a case where the total thickness HT is measured in the grinding apparatus 200. As a result, the distribution of the residual thickness HR can be calculated accurately, and the variation in the base thickness HB after the grinding can be certainly reduced.

Figure 3:
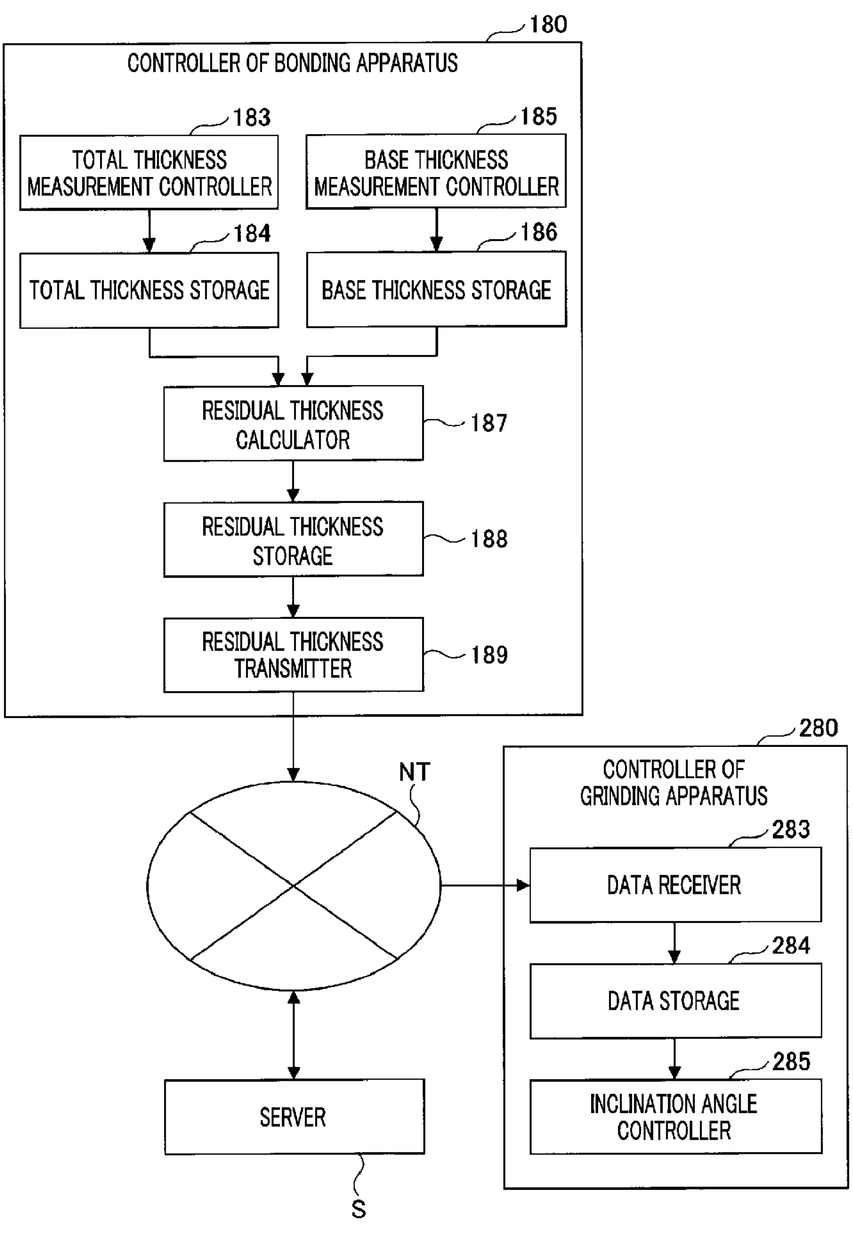
FIG. 3 is a functional block diagram illustrating components of a controller of a bonding apparatus and a controller of a grinding apparatus according to an exemplary embodiment.

As depicted in FIG. 3, a controller 180 of the bonding apparatus 100 and a controller 280 of the grinding apparatus 200 transmit and receive data through a network NT. The data measured in the bonding apparatus 100 is transmitted to the grinding apparatus 200 to be used for the grinding of the combined substrate T.

In addition, a server S is connected to the network NT, and the controller 180 of the bonding apparatus 100 and the controller 280 of the grinding apparatus 200 may transmit the data via the server S.

Since the data can be temporarily stored in the server S, loads on the controllers 180 and 280 can be reduced. The controller 180 of the bonding apparatus 100 may transmit the data when the bonding is being performed, and the controller 280 of the grinding apparatus 200 may receive the data when the grinding is being performed.

The server S may be a host computer configured to transmit instructions to the controller 180 of the bonding apparatus 100 and the controller 280 of the grinding apparatus 200. The controller 180 of the bonding apparatus 100 and the controller 280 of the grinding apparatus 200 respectively perform processings according to the instructions from a host computer.

The individual functional blocks shown in FIG. 3 will be described later. The individual functional blocks shown in FIG. 3 are conceptual and may not necessarily be physically configured exactly the same as shown in FIG. 3. All or a part of the functional blocks may be functionally or physically dispersed or combined on a unit. All or a part of processing functions performed in the respective functional blocks may be implemented by a program executed by the CPU or implemented by hardware through a wired logic. This is the same in FIG. 19, FIG. 22 and FIG. 23.

Now, referring to FIG. 5A and so forth, the bonding apparatus 100 will be described. The bonding apparatus 100 includes a first holder 110 configured to hold the first substrate W1, a second holder 120 configured to hold the second substrate W2, and the moving unit 130 configured to move the first holder 110 and the second holder 120 relative to each other.

The first holder 110 holds the first substrate W1 horizontally from above with a bonding surface W1*a* of the first substrate W1 facing downwards. The first holder 110 has, on a bottom surface thereof, a holding surface 111 holding the first substrate W1. The first holder 110 is, for example, a vacuum chuck, and has, in the holding surface 111, suction holes 112 for sucking the first substrate W1.

The first holder 110 is, for example, a pin chuck, and has ribs 113 and pins 114 on the holding surface 111. The ribs 113 are formed to have, for example, an annular shape, and serve to divide the holding surface 111 into a plurality of regions in the diametrical direction. The vacuum degree can be controlled independently in the plurality of regions, and the suction force can also be controlled independently in the plurality of regions. In each of the plurality of regions, the multiple pins 114 are disposed in a dispersed manner.

The second holder 120 holds the second substrate W2 horizontally from below with a bonding surface W2*a* of the second substrate W2 facing upwards. The second holder 120 has, on a top surface thereof, a holding surface 121 holding the second substrate W2. The second holder 120 is, for example, a vacuum chuck, and has, in the holding surface 121, suction holes 122 for sucking the second substrate W2.

The second holder 120 is, for example, a pin chuck, and includes ribs 123 and pins 124 on the holding surface 121. The ribs 123 are formed to have, for example, an annular shape, and serve to divide the holding surface 121 into a plurality of regions in the diametrical direction. The vacuum degree can be independently controlled in the plurality of regions, and the suction force can also be controlled independently in the plurality of regions. In each of the plurality of regions, the multiple pins 124 are disposed in a dispersed manner.

The moving unit 130 is, for example, an XYZ stage, and is configured to move the second holder 120 in the X-axis direction, the Y-axis direction, and the Z-axis direction. Further, although the moving unit 130 of the present exemplary embodiment is configured to move the second holder 120, it may be configured to move the first holder 110 instead, or move both the first holder 110 and the second holder 120.

The bonding apparatus 100 may be further equipped with a rotating unit 131 in addition to the moving unit 130. The rotating unit 131 is configured to rotate the second holder 120 around a vertical rotation center line. A XYZθ stage is formed by the rotating unit 131 and the moving unit 130. Further, although the rotating unit 131 of the present exemplary embodiment is configured to rotate the second holder 120, it may be configured to rotate the first holder 110 instead or rotate both the first holder 110 and the second holder 120 as long as the position alignment between the first substrate W1 and the second substrate W2 can be carried out.

Figure 4:
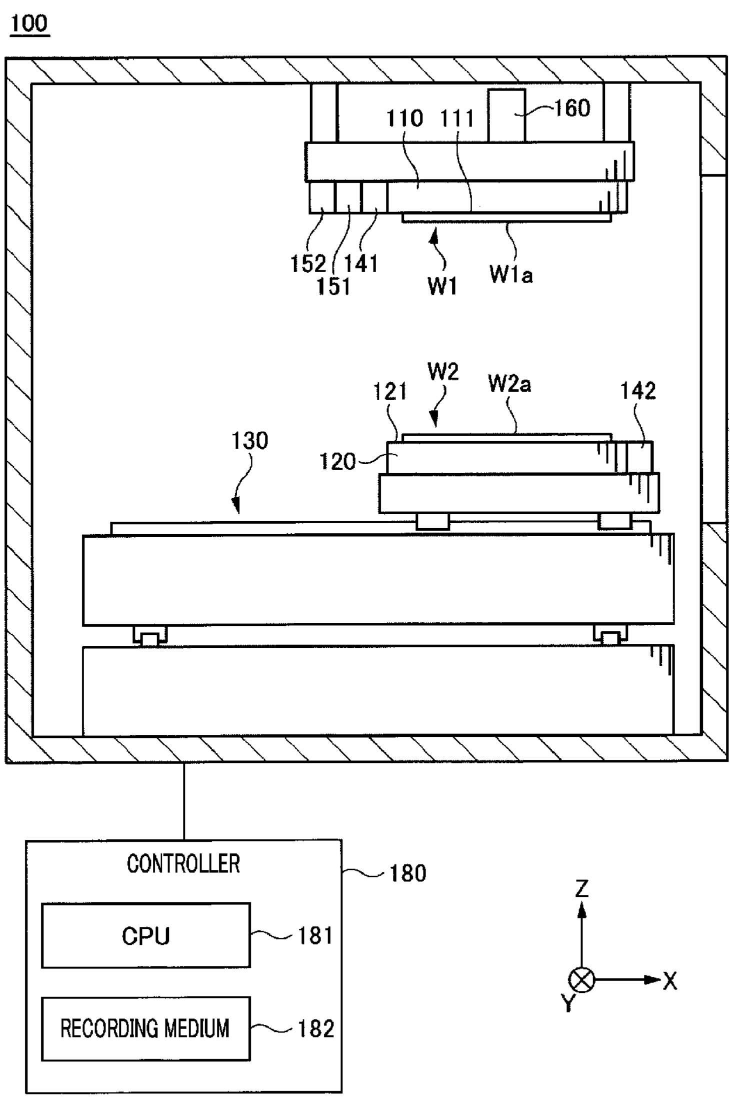
FIG. 4 is a side view illustrating the bonding apparatus according to the exemplary embodiment.

As shown in FIG. 4, the bonding apparatus 100 includes a first imaging unit 141 fixed to the first holder 110, and a second imaging unit 142 fixed to the second holder 120. The first imaging unit 141 is configured to image the bonding surface W2*a* of the second substrate W2 held by the second holder 120. Meanwhile, the second imaging unit 142 is configured to image the bonding surface W1*a* of the first substrate W1 held by the first holder 110.

The bonding apparatus 100 is further equipped with a thickness detector 151 configured to measure the total thickness HT of the combined substrate T. When the second holder 120 holds the combined substrate T, the thickness detector 151 is fixed to the first holder 110. If the moving unit 130 relatively moves the first holder 110 and the second holder 120, the position of the points where the total thickness HT is measured changes. Further, if the rotating unit 131 rotates the first holder 110 or the second holder 120, the position of the point where the total thickness HT is measured changes.

The thickness detector 151 is, for example, a height sensor configured to measure a height of a top surface of an object. Although the height sensor is of a non-contact type in the present exemplary embodiment, it may be of a contact type. Only one thickness detector 151 is provided in the present exemplary embodiment. However, more than one thickness detector 151 may be employed. Since the number of the points where the total thickness HT is measured is plural, the time required for the measurement can be shortened if the number of the thickness detectors 151 is increased.

The bonding apparatus 100 also includes a thickness detector 152 configured to measure the base thickness HB. When the second holder 120 holds the combined substrate T, the thickness detector 152 is fixed to the first holder 110. If the moving unit 130 relatively moves the first holder 110 and the second holder 120, the position of the points where the base thickness HB is measured changes. Further, if the rotating unit 131 rotates the first holder 110 or the second holder 120, the position of the points where the base thickness HB is measured changes.

The thickness detector 152 radiates light from above the base substrate B1, for example, and measures the base thickness HB from a phase difference between the light reflected from a top surface of the base substrate B1 and the light reflected from a bottom surface of the base substrate B1. When the base substrate B1 is a silicon wafer, infrared light is used. Some of the infrared light penetrates the silicon wafer to be reflected at an interface between the silicon wafer and the device layer D1. Although only one thickness detector 152 is provided in the present exemplary embodiment, more than one thickness detector 152 may be provided. Since the number of the points where the base thickness HB is measured is plural, the time required for the measurement can be shortened if the number of the thickness detectors 152 is increased.

The bonding apparatus 100 has a pressing unit 160 configured to transform the first substrate W1 held by the first holder 110. The pressing unit 160 presses a center of the first substrate W1 from above it, as illustrated in FIG. 5B. The bonding surface W1*a* of the first substrate W1 is transformed into a downwardly protruding curved surface, gradually bonded to the bonding surface W2*a* of the second substrate W2 from the center toward the periphery thereof, and finally returned to a flat surface.

The pressing unit 160 has a push pin 161, an actuator 162, and an elevating mechanism 163. The push pin 161 is disposed in a through hole formed through a central portion of the first holder 110 in a vertical direction. The actuator 162 is configured to press the push pin 161 downwards with a constant force by the air supplied from an electro-pneumatic regulator, for example. The elevating mechanism 163 is fixed to the first holder 110, and serves to move the actuator 162 up and down.

As depicted in FIG. 4, the bonding apparatus 100 has a controller 180 configured to control an operation of the bonding apparatus 100. The controller 180 is, for example, a computer, and includes a CPU (Central Processing Unit) 181 and a recording medium 182 such as a memory. The recording medium 182 stores therein a program for controlling various kinds of processings performed in the bonding apparatus 100. The controller 180 controls the operation of the bonding apparatus 100 by causing the CPU 181 to execute the program stored in the recording medium 182.

As shown in FIG. 3, the controller 180 includes, for example, a total thickness measurement controller 183, a total thickness storage 184, a base thickness measurement controller 185, a base thickness storage 186, a residual thickness calculator 187, a residual thickness storage 188, and a residual thickness transmitter 189. The total thickness measurement controller 183 is configured to control the thickness detector 151 to measure the total thickness HT at multiple points P (see FIG. 10). A method of measuring the total thickness HT will be elaborated later.

The total thickness storage 184 is configured to store therein the data measured by the total thickness measurement controller 183. For example, the total thickness storage 184 stores therein the total thickness HT while matching it with the position of the point P where the total thickness HT is measured. If the data such as the total thickness HT is temporarily stored, the calculation of the residual thickness HR can be carried out at any time.

The base thickness measurement controller 185 is configured to control the thickness detector 152 to measure the base thickness HB at the multiple points P. The points P at which the base thickness HB is measured and the points P at which the total thickness HT is measured are the same points within the surface of the combined substrate T. By calculating the difference between the total thickness HT and the base thickness HB measured at the same point P, the residual thickness HR can be accurately measured.

The base thickness storage 186 is configured to store therein the data measured by the base thickness measurement controller 185. By way of example, the base thickness storage 186 stores the base thickness HB while matching it with the position of the point P where the base thickness HB is measured. If the data such as the base thickness HB is temporarily stored, the calculation of the residual thickness HR can be carried out at any time.

The residual thickness calculator 187 is configured to calculate the thickness HR of the remainder R of the combined substrate T except the base substrate B1 from the data measured by the total thickness measurement controller 183 and the data measured by the base thickness measurement controller 185 at the multiple points P. The residual thickness HR is obtained by calculating the difference between the total thickness HT and the base thickness HB measured at the same point P within the surface of the combined substrate T.

The residual thickness storage 188 is configured to store therein the data calculated by the residual thickness calculator 187. By way of example, the residual thickness storage 188 stores the residual thickness HR while matching it with the position of the point P where the residual thickness HR is measured. If the data such as the residual thickness HR is temporarily stored, the data such as the residual thickness HR can be transmitted at any time.

The residual thickness transmitter 189 is configured to transmit the data calculated by the residual thickness calculator 187 to the outside of the bonding apparatus 100. By way of example, the residual thickness transmitter 189 may send the grinding apparatus 200 the data including the residual thickness HR and the positions of the multiple points P where the residual thickness HR is measured. The residual thickness transmitter 189 may transmit the data such as the residual thickness HR to the grinding apparatus 200 via the server S Now, with reference to FIG. 6, an operation of the bonding apparatus 100 will be explained. Individual processes shown in FIG. 6 are performed under the control of the controller 180 of the bonding apparatus 100.

Figure 6:
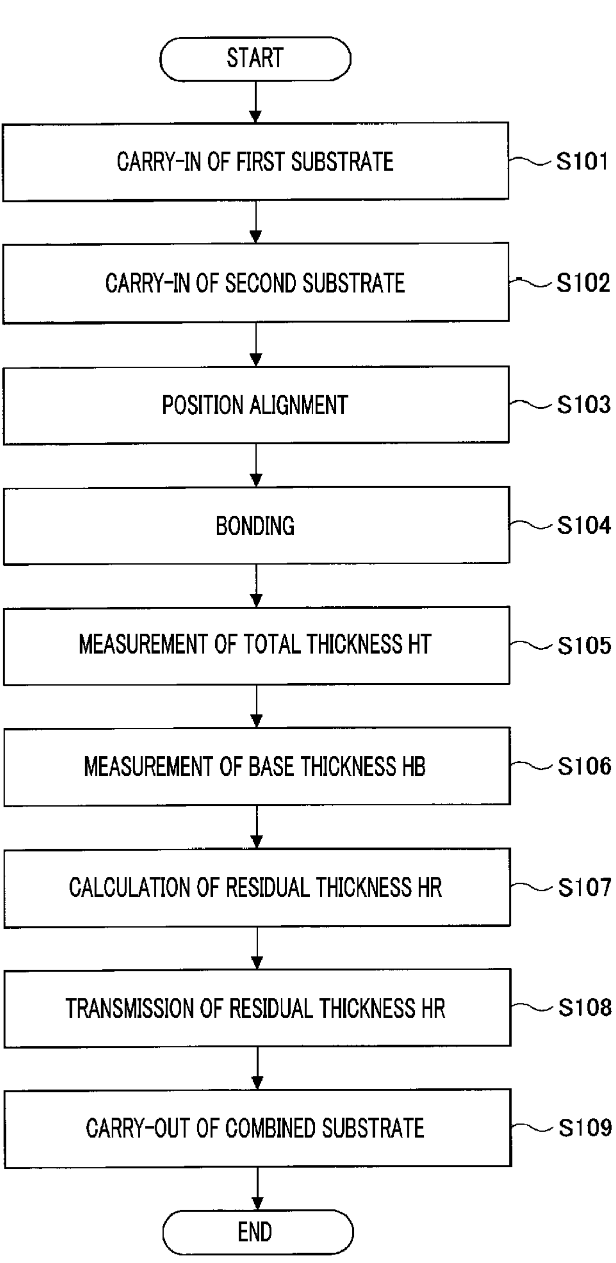
FIG. 6 is a flowchart illustrating a bonding method according to the exemplary embodiment.

First, in a process S101 of FIG. 6, a non-illustrated transfer device carries the first substrate W1 into the bonding apparatus 100, and hands the first substrate W1 over to the first holder 110. The first holder 110 holds the first substrate W1 from above with the bonding surface W1*a* of the first substrate W1 facing downwards.

Next, in a process S102 of FIG. 6, the transfer device carries the second substrate W2 into the bonding apparatus 100, and hands the substrate W2 over to the second holder 120. The second holder 120 holds the second substrate W2 from below with the bonding surface W2*a* of the second substrate W2 facing upwards.

Further, before receiving the second substrate W2 from the transfer device, the second holder 120 may hand an already bonded combined substrate T over to the transfer device. In addition, although the process S102 (carry-in of the second substrate W2) is performed after the process S101 (carry-in of the first substrate W1) in FIG. 6, the process S101 may be performed after the process S102. The order of the processes S101 and S102 is not particularly limited.

Next, in a process S103 of FIG. 6, the controller 180 controls the moving unit 130 to align the first substrate W1 and the second substrate W2. Hereinafter, the process S103 of FIG. 6 will be explained with reference to FIG. 7A to FIG. 7C.

Figures 7A, 7B, 7C:
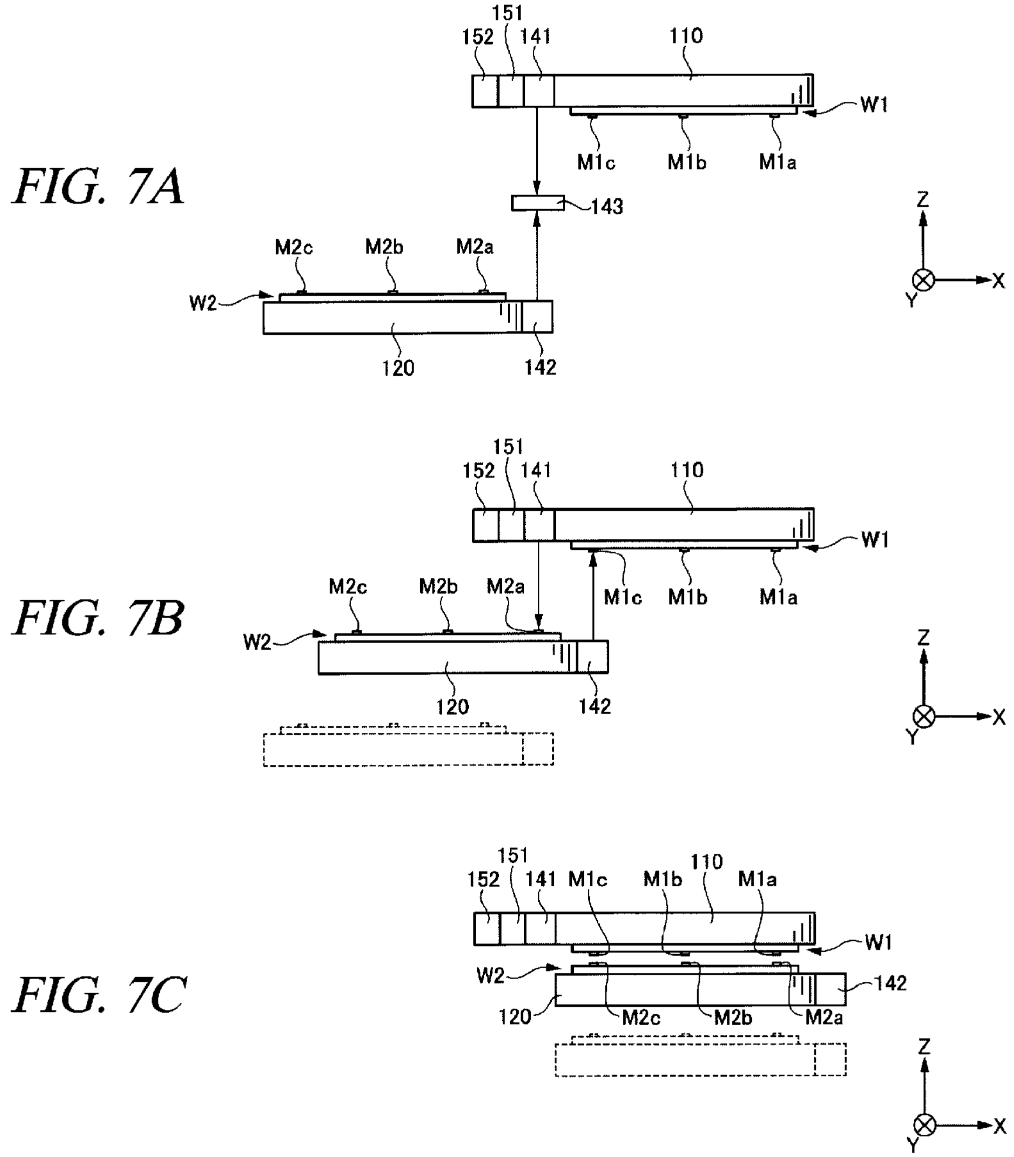
FIG. 7A is a side view illustrating an example of target imaging.
FIG. 7B is a side view illustrating an example of alignment mark imaging.
FIG. 7C is a side view illustrating an example of position alignment.

First, as shown in FIG. 7A, the positions of the first imaging unit 141 and the second imaging unit 142 in a horizontal direction are aligned. Specifically, the moving unit 130 moves the first holder 110 and the second holder 120 relatively to each other in the horizontal direction so that the first imaging unit 141 and the second imaging unit 142 lie on the same vertical line. Then, the first imaging unit 141 and the second imaging unit 142 image a common target 143, and the moving unit 130 corrects the relative positions of the first holder 110 and the second holder 120 in the horizontal direction such that the positions of the first imaging unit 141 and the second imaging unit 142 in the horizontal direction are coincident.

Now, as shown in FIG. 7B, the moving unit 130 moves the second holder 120 vertically upwards from a position marked by a dashed line in FIG. 7B so that the moving unit 130 can relatively bring the first holder 110 and the second holder 120 closer to each other. Further, the position of the second holder 120 indicated by the dashed line in FIG. 7B is a position of the second holder 120 indicated by a solid line in FIG. 7A.

Thereafter, as shown by a solid line in FIG. 7B, the moving unit 130 relatively moves the first holder 110 and the second holder 120 in the horizontal direction. In this way, the first imaging unit 141 images alignment marks M2*a*, M2*b* and M2*c* of the bonding surface W2*a* of the second substrate W2 in sequence. Concurrently, the second imaging unit 142 images alignment marks M1*c*, M1*b* and M1*a* of the bonding surface W1*a* of the first substrate W1 in sequence. FIG. 7B illustrates a state in which the first imaging unit 141 is imaging the alignment mark M2*a* of the bonding surface W2*a* of the second substrate W2 while the second imaging unit 142 is imaging the alignment mark M1*c* of the bonding surface W1*a* of the first substrate W1.

The first imaging unit 141 and the second imaging unit 142 transmit the obtained image data to the controller 180. Based on the image data acquired by the first imaging unit 141 and the image data acquired by the second imaging unit 142, the controller 180 controls the moving unit 130 to align the first substrate W1 and the second substrate W2 in the horizontal direction.

As indicated by a dashed line in FIG. 7C, the alignment of the first substrate W1 and the second substrate W2 in the horizontal direction is performed such that the alignment marks M1*a*, M1*b* and M1*c* of the first substrate W1 overlap the alignment marks M2*a*, M2*b* and M2*c* of the second substrate W2, when viewed from the top. In this alignment, the rotating unit 131 may also be used in addition to the moving unit 130.

Next, as shown by a solid line in FIG. 7C, the positions of the first substrate W1 and the second substrate W2 in a vertical direction are aligned. Specifically, the moving unit 130 moves the second holder 120 vertically upwards, thus allowing the second substrate W2 to approach the first substrate W1. A gap between the bonding surface W1*a* of the first substrate W1 and the bonding surface W2*a* of the second substrate W2 is adjusted to a predetermined distance, for example, 50 μm to 200 μm.

Subsequently, in a process S104 of FIG. 6, the controller 180 controls the pressing unit 160 to bond the first substrate W1 and the second substrate W2. Hereinafter, the process S104 of FIG. 6 will be described with reference to FIG. 5A to FIG. 5C.

Figure 5A:
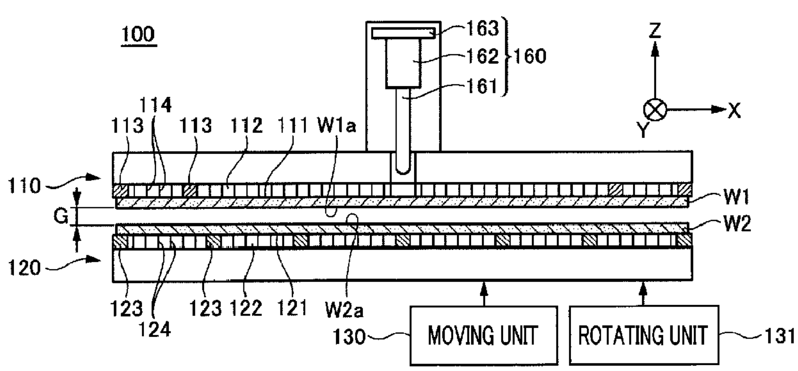
FIG. 5A is a cross sectional view illustrating an example of position alignment.
Figure 5B:
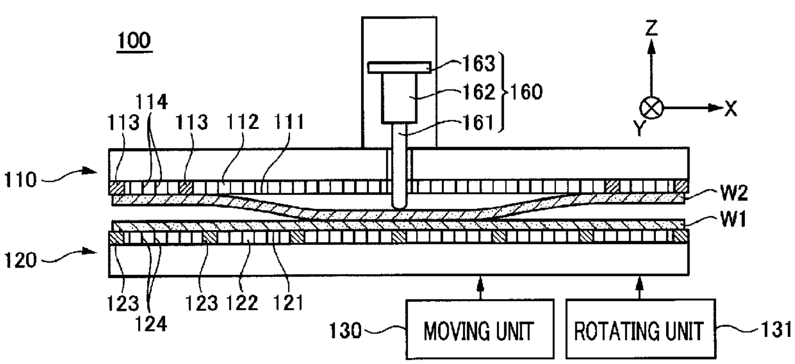
FIG. 5B is a cross sectional view illustrating an example of bonding start.

As shown in FIG. 5A, upon the completion of the alignment, the first substrate W1 and the second substrate W2 are respectively attracted flat. A gap G between the bonding surface W1*a* of the first substrate W1 and the bonding surface W2*a* of the second substrate W2 is, for example, 50 μm to 200 μm.

Then, as depicted in FIG. 5B, the bonding apparatus 100 releases the attraction of the center of the first substrate W1, and presses the center of the first substrate W1 with the pressing unit 160 from above it. As a result, the center of the first substrate W1 comes into contact with a center of the second substrate W2, so that bonding is started. Then, the first substrate W1 and the second substrate W2 are gradually bonded from the centers toward peripheries thereof.

Figure 5C:
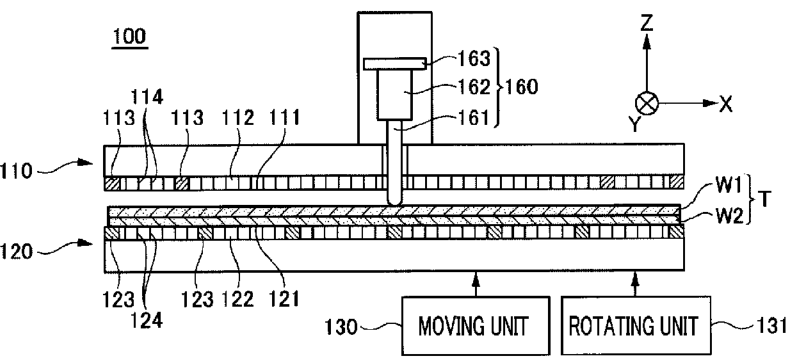
FIG. 5C is a cross sectional view illustrating an example of bonding completion.

Finally, as shown in FIG. 5C, the bonding apparatus 100 releases the attraction of the periphery of the first substrate W1 in the state that the center of the first substrate W1 is pressed against the center of the second substrate W2 with the pressing unit 160. As a result, the bonding surface W1*a* of the first substrate W1 and the bonding surface W2*a* of the second substrate W2 come into whole contact with each other, so that the first substrate W1 and the second substrate W2 are bonded to each other, and the combined substrate T is obtained. The combined substrate T is held by the second holder 120.

Thereafter, in a process S105 of FIG. 6, the total thickness measurement controller 183 controls the thickness detector 151 to measure the total thickness HT of the combined substrate T at the multiple points P. Further, the total thickness measurement controller 183 also controls the moving unit 130 or the rotating unit 131 to control the positions of the points P at which the total thickness HT is measured by the thickness detector 151.

Since the bonding apparatus 100 requires the high-accuracy position control as compared to the grinding apparatus 200, it has, in each of the moving unit 130 and the rotating unit 131, a motor having high responsiveness to a position instruction and high position resolution. Instead of or in addition to such a high-performance motor, a device configured to absorb a vibration may sometimes be mounted to the bonding apparatus 100. It is because the bonding apparatus 100 performs the alignment between the first substrate W1 and the second substrate W2 before bonding the first substrate W1 and the second substrate W2.

In the present exemplary embodiment, since the total thickness HT is measured in the bonding apparatus 100, the position determination accuracy of the points P at which the total thickness HT is measured can be improved, as compared to a case where the total thickness HT is measured in the grinding apparatus 200. Since the total thickness HT can be measured at the required points P, the total thickness HT and the base thickness HB can be measured at the same points P within the surface of the combined substrate T. As a result, the distribution of the residual thickness HR can be calculated accurately, so that the variation in the base thickness HB after the grinding can be reduced reliably.

Figures 8A, 8B:
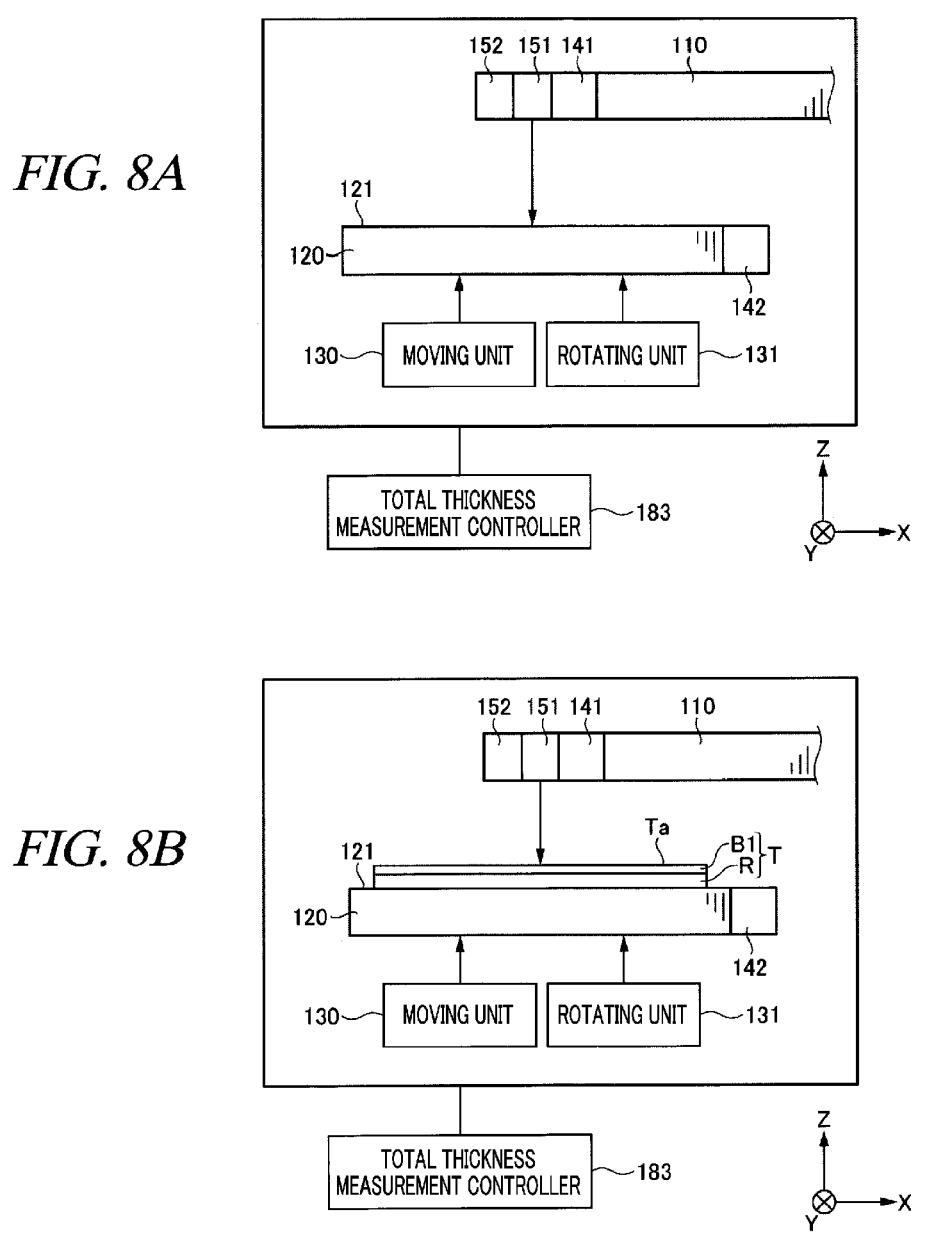

As shown in FIG. 8A, the total thickness measurement controller 183 previously measures a position of the holding surface 121 of the second holder 120 in the Z-axis direction at the multiple points P (see FIG. 10) in the state that the holding surface 121 is exposed. These points P are the points at which the total thickness HT is measured.

Further, in the present exemplary embodiment, the holding surface 121 is positioned horizontally, and a direction orthogonal to the holding surface 121 is the Z-axis direction. Hereinafter, the position in this Z-axis direction position will be also called a height.

The thickness detector 151 is, by way of non-limiting example, a laser displacement meter. The laser displacement meter is capable of measuring a distance to the holding surface 121 from the laser displacement meter in a non-contact manner by radiating a laser beam to the holding surface 121 of the second holder 120 and receiving the reflected light.

Measurement of the height of the holding surface 121 is performed before the carry-in (process S102) of the second substrate W2. Further, the height measurement of the holding surface 121 may be performed after the carry-out (process S109) of the combined substrate T. With the holding surface 121 exposed, it is possible to measure the height of the holding surface 121.

Furthermore, as shown in FIG. 8B, the total thickness measurement controller 183 measures a height of a front surface Ta of the combined substrate T at the multiple points P in the state that the combined substrate T is held on the holding surface 121 of the second holder 120. The front surface Ta of the combined substrate T is opposite to (for example, above) a rear surface thereof which is in contact with the second holder 120. The height of the front surface Ta of the combined substrate T and the height of the holding surface 121 of the second holder 120 are measured at the same multiple points P. The points P where the height of the front surface Ta of the combined substrate T is measured and the points P where the height of the holding surface 121 of the second holder 120 is measured are the same points P when viewed from the vertical direction.

In measuring the height of the front surface Ta of the combined substrate T and in measuring the height of the holding surface 121 of the second holder 120, the second holder 120 may be controlled to the same positions in the X-axis direction, the Y-axis direction, and the Z-axis direction. In this case, a difference between the height of the front surface Ta of the combined substrate T and the height of the holding surface 121 of the second holder 120 is equal to the total thickness HT of the combined substrate T. However, instead of the configuration in which the second holder 120 is moved, the thickness detector 151 may be moved, or both of them may be moved. The height measurement of the holding surface 121 of the second holder 120 and the height measurement of the front surface Ta of the combined substrate T need to be performed in the state that the relative positions (the positions in the X-axis direction, the Y-axis direction, and the Z-axis direction) of the second holder 120 and the thickness detector 151 are the same. In this case, the difference between the height of the front surface Ta of the combined substrate T and the height of the holding surface 121 of the second holder 120 is equal to the total thickness HT of the combined substrate T.

The total thickness measurement controller 183 calculates the difference between the height of the front surface Ta of the combined substrate T and the height of the holding surface 121 of the second holder 120 at the multiple points P, and calculates the total thickness HT at the multiple points P. These calculations may be performed after the carry-out (process S109) of the combined substrate T is performed.

According to the present exemplary embodiment, the difference between the height of the front surface Ta of the combined substrate T and the height of the holding surface 121 of the second holder 120 is calculated at the same points P when viewed from the vertical direction. Therefore, even when the total thickness HT of the combined substrate T is non-uniform, the total thickness HT can be accurately measured. As compared to a case where the difference between the height of the front surface Ta of the combined substrate T and the height of the holding surface 121 of the second holder 120 is calculated at different points, the distribution of the total thickness HT of the combined substrate T can be measured with high accuracy.

The total thickness storage 184 stores the total thicknesses HT measured by the total thickness measurement controller 183 while matching it with the position of the point P at which those total thicknesses HT is measured. The positions of the multiple points P may be stored with reference to a position of a notch indicating a crystal orientation of the first substrate W1 or the second substrate W2.

In addition, when measuring the height of the front surface Ta of the combined substrate T and when measuring the height of the holding surface 121 of the second holder 120, the second holder 120 may need to be controlled to the same positions in the X-axis direction and the Y-axis direction only, while the second holder 120 may be displaced in the Z-axis direction. In this case, the total thickness HT of the combined substrate T is calculated in consideration of the displacement amount of the second holder 120 in the Z-axis direction. However, instead of this configuration in which the second holder 120 is moved in the X-axis direction and the Y-axis direction, a configuration in which the thickness detector 151 is moved in the X-axis direction and the Y-axis direction, or a configuration in which one of the second holder 120 and the thickness the detectors 151 is moved in the X-axis direction while the other is moved in the Y-axis direction may be adopted. That is, the height measurement of the holding surface 121 of the second holder 120 and the height measurement of the front surface Ta of the combined substrate T need to be performed in the state that the relative positions (the positions in the X-axis direction and Y-axis direction) of the second holder 120 and the thickness detector 151 are the same, when viewed from the Z-axis direction.

Figures 9A, 9B:
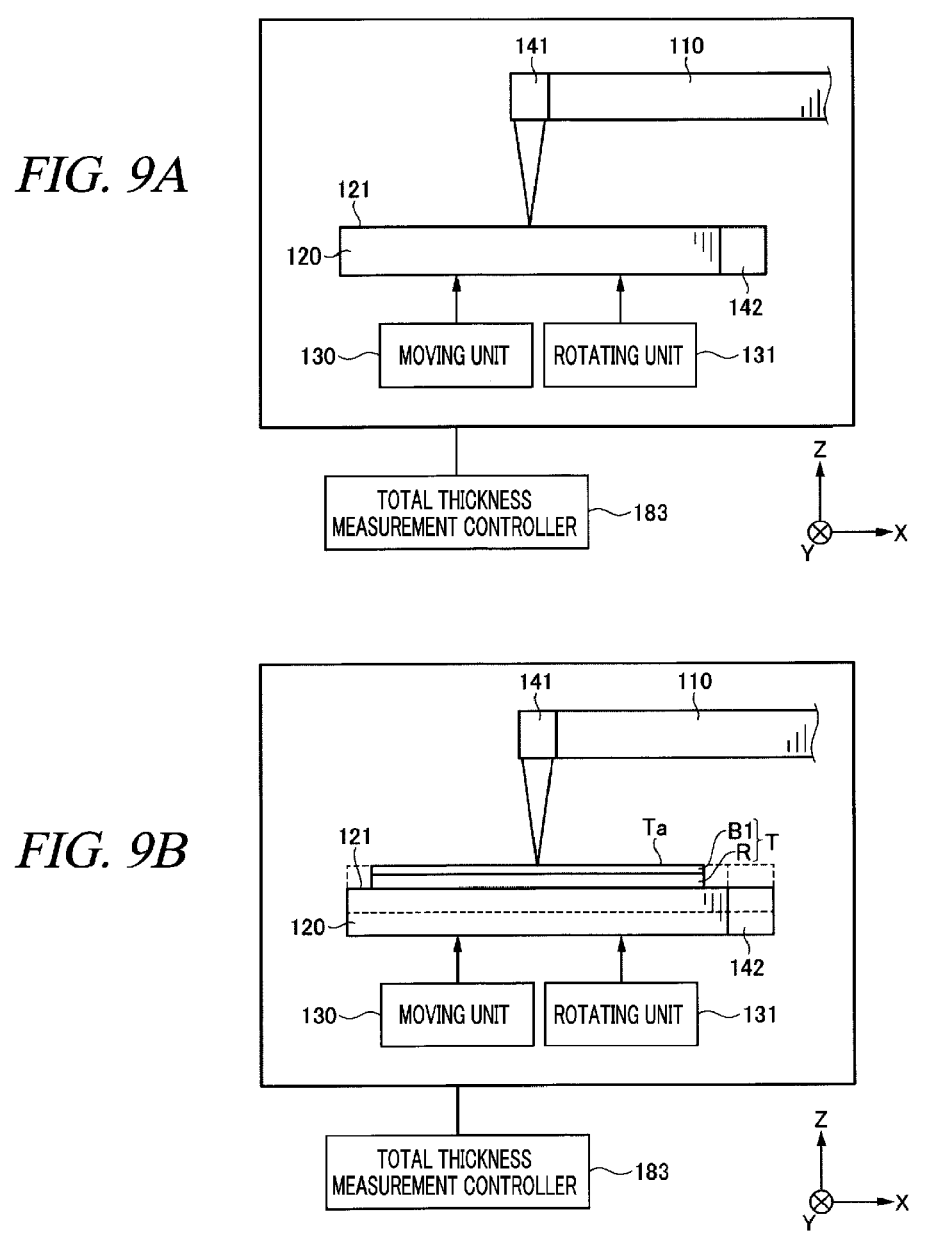

Furthermore, the thickness detector 151 is not limited to the laser displacement meter. By way of example, as shown in FIG. 9A and FIG. 9B, the first imaging unit 141 may be used as the thickness detector 151. That is, the thickness detector 151 may include a camera.

In this case, the total thickness measurement controller 183 measures the total thickness HT of the combined substrate T by the focusing of the camera. For example, the focusing of the camera is carried out by moving the second holder 120 in the Z-axis direction such that the edge intensity of the object reflected on an image captured by the camera may be maximized. Here, the edge intensity is the size of the difference in the amount of light received on both sides with the edge of the object therebetween.

As shown in FIG. 9A, the total thickness measurement controller 183 focuses the camera on the holding surface 121 in the state that the holding surface 121 of the second holder 120 is exposed. The camera is sequentially focused on each of the multiple points P. This focusing is performed before the carry-in (process S102) of the second substrate W2. In addition, this focusing may be performed after the carry-out (process S109) of the combined substrate T. The total thickness measurement controller 183 stores the position of the second holder 120 in the Z-axis direction at the time of this focusing.

Further, as shown in FIG. 9B, the total thickness measurement controller 183 focuses the camera on the front surface Ta of the combined substrate T in the state that the combined substrate T is held on the holding surface 121 of the second holder 120. The total thickness measurement controller 183 stores the position of the second holder 120 in the Z-axis direction at the time of this focusing.

The total thickness measurement controller 183 calculates, at the multiple points P, a shift amount of the second holder 120 in the Z-axis direction in the two cases where the camera is focused on the front surface Ta of the combined substrate T and where the camera is focused on the holding surface 121 of the second holder 120. The shift amount is equal to the total thickness HT of the combined substrate T. Therefore, the total thickness HT can be calculated at the multiple points P.

In addition, the focusing of the camera may include moving the first holder 110 in the Z-axis direction instead of moving the second holder 120 in the Z-axis direction. Since the first imaging unit 141 is fixed to the first holder 110, it is moved in the Z-axis direction along with the first holder 110.

Figure 10:
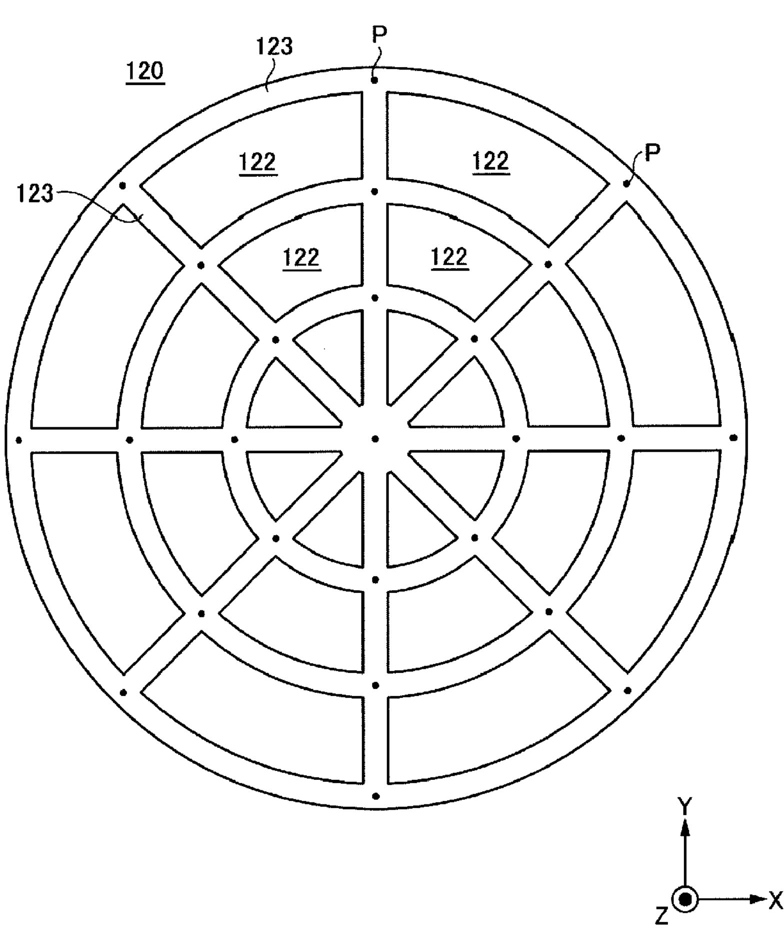
FIG. 10 is a plan view illustrating an example of arrangement of points where a total thickness is measured.

FIG. 10 shows the arrangement of the points P where the total thickness HT of the combined substrate T is measured. The multiple points P are arranged on the holding surface 121 of the second holder 120 so as not to be overlapped with the suction holes 122. By arranging the multiple points P at the positions not overlapping the suction holes 122, the height of the holding surface 121 can be measured.

The second holder 120 has, on the holding surface 121 thereof, the ribs 123 that form a flat surface. The multiple points P are arranged on the flat surface of the ribs 123. By measuring the height of the flat surface of the ribs 123, the height of the holding surface 121 may be accurately measured.

A part of the flat surface of the ribs 123 may be formed in a straight line shape. The rib 123 having the straight line shape may be disposed in the diametrical direction of the combined substrate T, the height of the holding surface 121 can be measured at multiple points in the diametrical direction of the combined substrate T, and, besides, the total thickness HT of the combined substrate T can be measured at the multiple points in the diametrical direction.

A part of the flat surface of the ribs 123 may be formed in the straight line shape, and may be formed to pass through a center of the holding surface 121. The height of the holding surface 121 can be measured at a central point of the combined substrate T in the diametrical direction, and, besides, the total thickness HT can be measured at the central point of the combined substrate T in the diametrical direction.

Another part of the flat surface of the ribs 123 may be formed in an annular shape. The rib 123 having the annular shape may be disposed in a circumferential direction of the combined substrate T, the height of the holding surface 121 can be measured at multiple points in the circumferential direction of the combined substrate T, and, besides, the total thickness HT can be measured at the multiple points in the circumferential direction of the combined substrate T.

The ribs 123 having annular shapes with different diameters may be concentrically arranged. The height of the holding surface 121 can be measured at multiple points in the diametrical direction of the combined substrate T, and, besides, the total thickness HT can be measured at the multiple points in the diametrical direction of the combined substrate T.

Moreover, the rib 123 having a circular shape may be disposed at a center of the rib 123 having an annular shape. The height of the holding surface 121 can be measured at the central point of the combined substrate T in the diametrical direction thereof, and, besides, the total thickness HT can be measured at the central point of the combined substrate T in the diametrical direction thereof.

When the second holder 120 has the rib 123 of the annular shape, the position of the point P where the height of the holding surface 121 is measured may be displaced in the circumferential direction of the combined substrate T if the bonding apparatus 100 has the rotating unit 131 configured to rotate the holding surface 121.

Figure 11:
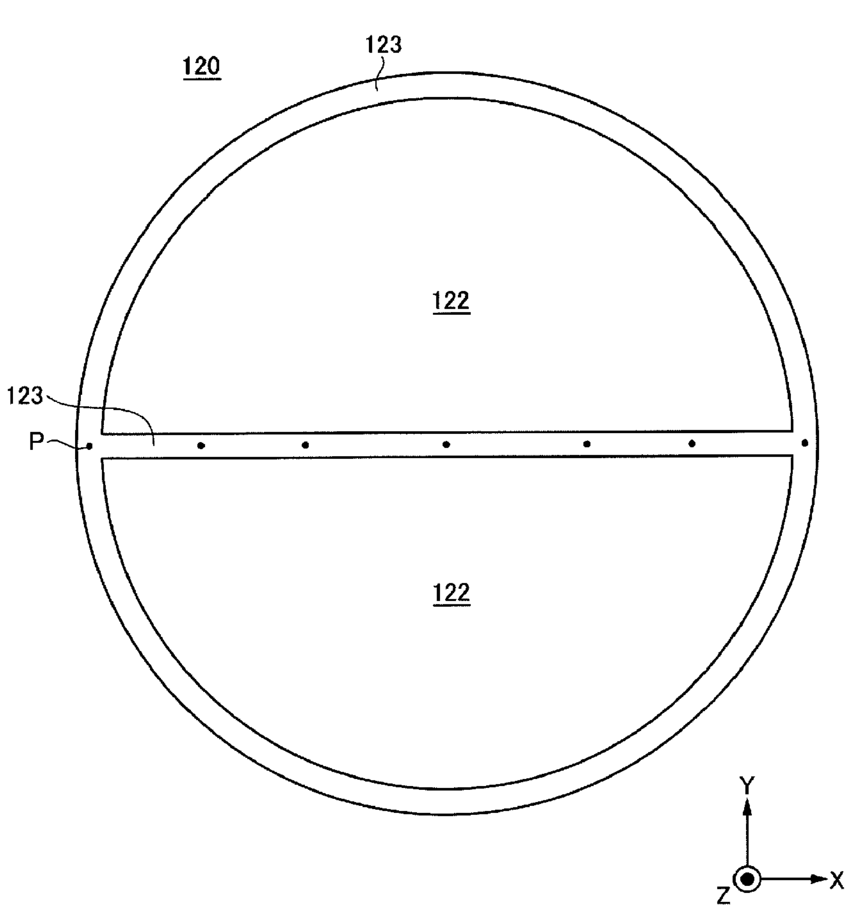
FIG. 11 is a plan view illustrating a modification example of the arrangement of the points where the total thickness is measured.

Further, the flat surface of the ribs 123 may have an annular portion having the same diameter as that of the combined substrate T, as shown in FIG. 11, and may have only a straight line-shaped portion inside that annular portion. Though not shown, the flat surface of the ribs 123 may have only annular portions with different diameters that are concentrically arranged.

In addition, the multiple points P may be disposed on leading end surfaces of the pins 124 instead of the leading end surfaces of the ribs 123 as long as they do not overlap with the suction holes 122. Furthermore, the multiple points P may be arranged while being dispersed on both the leading end surface of the ribs 123 and the leading end surface of the pins 124.

Moreover, the second holder 120 is not limited to the pin chuck, and it may be a porous chuck. The porous chuck includes a porous body. Since the porous body includes a plurality of suction holes, the multiple points P may be arranged at positions not overlapping the porous body. The multiple points P may be arranged on leading end surfaces of ribs that divide the porous body into a plurality of regions.

As described above, in the process S105 of FIG. 6, the total thickness measurement controller 183 controls the thickness detector 151 to measure the total thickness HT of the combined substrate T at the multiple points P. In the process S105, the height of the front surface Ta of the combined substrate T is measured. Further, the height measurement of the holding surface 121 of the second holder 120 may be performed before the process S102 (carry-in of the second substrate W2) of FIG. 6, or after the process S108 (carry-out of the combined substrate) of FIG. 6.

Figure 12:
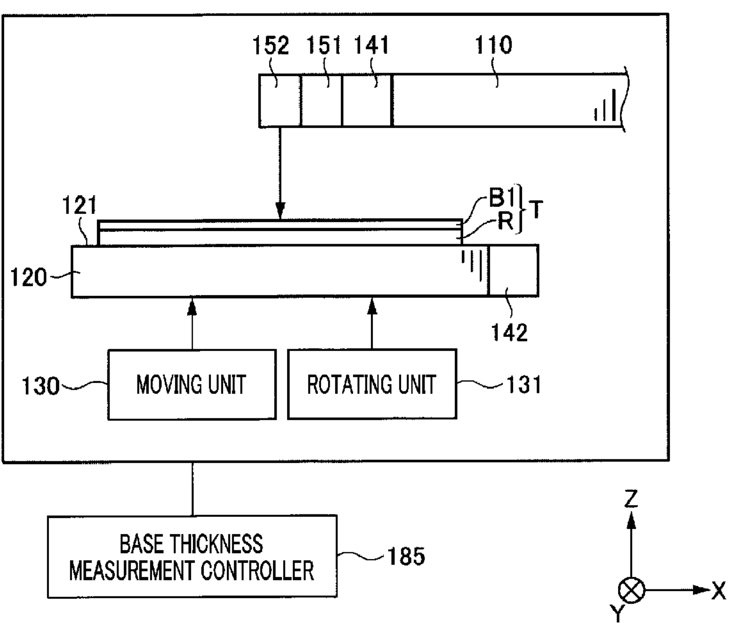
FIG. 12 is a side view illustrating an example of base thickness measurement.

Subsequently, in a process S106 of FIG. 6, the base thickness measurement controller 185 controls the thickness detector 152 to measure the thickness HB of the base substrate B1 at the multiple points P, as shown in FIG. 12. Further, the base thickness measurement controller 185 also controls the moving unit 130 or the rotating unit 131 to control the positions of the points P at which the base thickness HB is measured by the thickness detector 152.

In the present exemplary embodiment, since the base thickness HB is measured in the bonding apparatus 100, the position determination accuracy of the points P at which the base thickness HB is measured can be improved, as compared to a case where the base thickness HB is measured in the grinding apparatus 200. Since the base thickness HB can be measured at the required points P, it is possible to measure the base thickness HB and the total thickness HT at the same points P within the surface of the combined substrate T. As a result, the distribution of the residual thickness HR can be calculated accurately, and the variation in the base thickness HB after the grinding can be reduced securely.

The points P at which the base thickness HB is measured and the points P at which the total thickness HT is measured are the same points within the surface of the combined substrate T. By calculating the difference between the total thickness HT and the base thickness HB measured at the same point P within the surface of the combined substrate T, the residual thickness HR can be accurately measured. The base thickness HB is stored while being matched with the position of the point P at which the base thickness HB is measured. The positions of the multiple points P may be stored with reference to the position of the notch indicating the crystal orientation of the first substrate W1 or the second substrate W2.

Further, although the process S106 (measurement of the base thickness HB) is performed after the process S105 (measurement of the total thickness HT) in FIG. 6, it may be also possible that the process S105 is performed after the process S106. The order of the processes S105 and S106 is not specifically limited.

Now, in a process S107 of FIG. 6, the residual thickness calculator 187 calculates the thickness HR of the remainder R of the combined substrate T except the base substrate B1 at the multiple points P from the data measured by the total thickness measurement controller 183 and the data measured by the base thickness measurement controller 185. The residual thickness HR is obtained by calculating the difference between the total thickness HT and the base thickness HB measured at the same point P within the surface of the combined substrate T.

The residual thickness HR tends to be uniform in the circumferential direction of the combined substrate T and non-uniform in the diametrical direction of the combined substrate T. For example, as shown in FIG. 2A, the residual thickness HR gradually decreases as it goes from the center of the combined substrate T toward the periphery thereof.

Thus, the residual thickness calculator 187 may calculate an average value of the residual thickness HR for each distance from the center of the combined substrate T. The average value can be calculated when the multiple points P are arranged in an annular shape. An average distribution of the residual thickness HR in the diametrical direction of the combined substrate T can be found out.

Subsequently, in a process S108 of FIG. 6, the residual thickness transmitter 189 transmits, to the outside of the bonding apparatus 100, the data of the residual thickness HR and the positions of the multiple points P where the residual thickness HR is measured. For example, the residual thickness transmitter 189 transmits the data such as the residual thickness HR to the grinding apparatus 200. The residual thickness transmitter 189 may transmit the data such as the residual thickness HR to the grinding apparatus 200 via the server S.

Finally, in a process S109 of FIG. 6, the second holder 120 releases the holding of the combined substrate T, and the non-illustrated transfer device receives the combined substrate T from the second holder 120, and carries the received combined substrate T to the outside of the bonding apparatus 100.

Further, the order of the process S107 (calculation of the residual thickness HR), the process S108 (transmission of the residual thickness HR), and the process S109 (carrying-out of the combined substrate T) of FIG. 6 is not particularly limited. After the process S109, the processes S107 and S108 may be performed.

Moreover, although the bonding apparatus 100 of the present exemplary embodiment has the first holder 110 above the second holder 120 as shown in FIG. 5A and so forth, it may be possible to adopt a configuration in which the first holder 110 is provided under the second holder 120. In this case, the first holder 110 holds the first substrate W1 from below with the bonding surface W1*a* of the first substrate W1 facing upwards. Further, the second holder 120 holds the second substrate W2 from above with the bonding surface W2*a* of the second substrate W2 facing downwards. Then, the pressing unit 160 transforms the second substrate W2 held by the second holder 120. The pressing unit 160 presses the center of the second substrate W2 from above it. Therefore, the combined substrate T is held by the first holder 110. When the first holder 110 holds the combined substrate T, the thickness detectors 151 and 152 are fixed to the second holder 120. The total thickness measurement controller 183 controls the moving unit 130 or the rotating unit 131 to control the positions of the points P at which the total thickness HT is measured. Further, the base thickness measurement controller 185 controls the moving unit 130 or the rotating unit 131 to control the positions of the points P at which the base thickness HB is measured.

Figure 13:
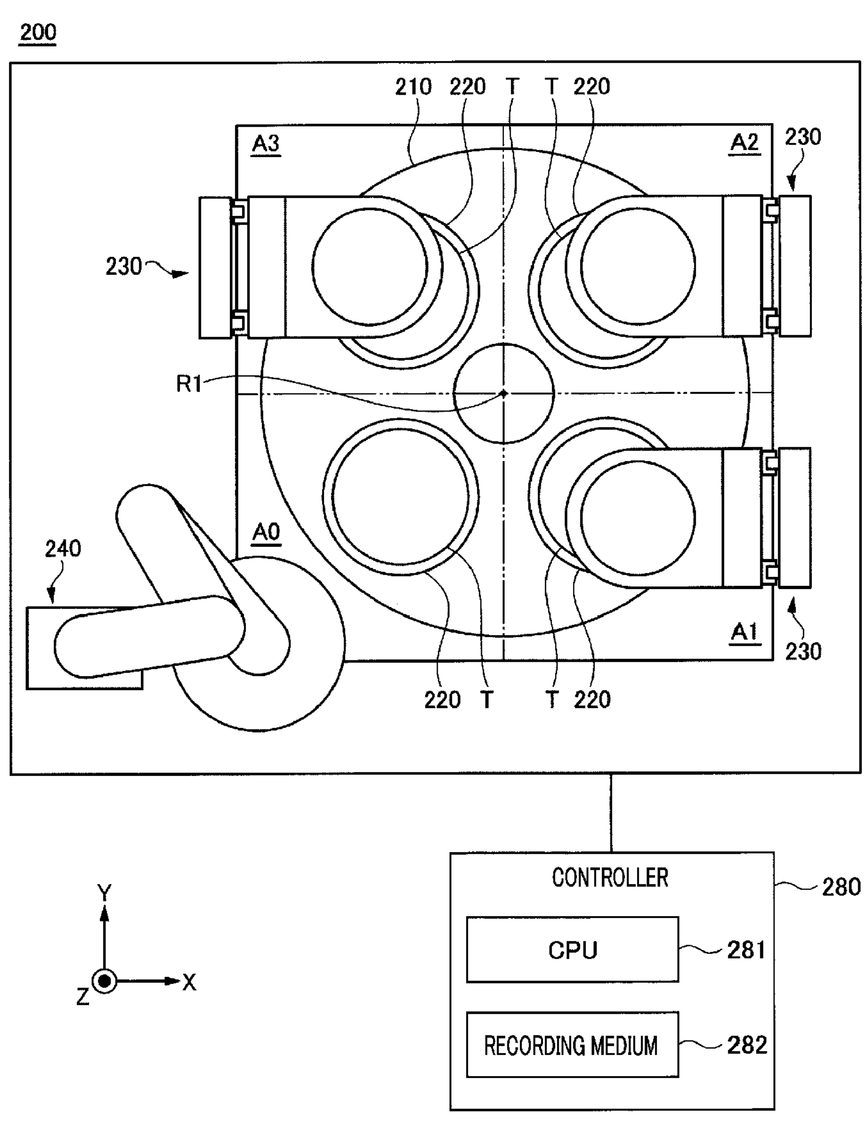
FIG. 13 is a plan view illustrating the grinding apparatus according to the exemplary embodiment.

Now, the grinding apparatus 200 will be elaborated with reference to FIG. 13. The grinding apparatus 200 is configured to grind the base substrate B1 of the combined substrate T. The grinding includes polishing. Either one of fixed abrasive grains and loose abrasive grains may be used as abrasive grains for use in the grinding. The grinding apparatus 200 includes, by way of example, a rotary table 210, four chucks 220, and three grinding units 230.

The rotary table 210 holds the four chucks 220 around a rotation center line R1 at a regular distance therebetween, and is rotated around the rotation center line R1. Each of the four chucks 220 is rotated along with the rotary table 210, and moved to a carry-in/out position A0, a first grinding position A1, a second grinding position A2 and a third grinding position A3, and back to the carry-in/out position A0 in this sequence.

The carry-in/out position A0 serves as a carry-in position where a carry-in of the combined substrate T is performed and a carry-out position where a carry-out of the combined substrate T is performed. Further, though the carry-in position and the carry-out position are identical in the present exemplary embodiment, they may be different. The first grinding position A1 is a position where a first grinding is performed. The second grinding position A2 is a position where a second grinding is performed. The third grinding position A3 is a position where a third grinding is performed.

Figure 14:
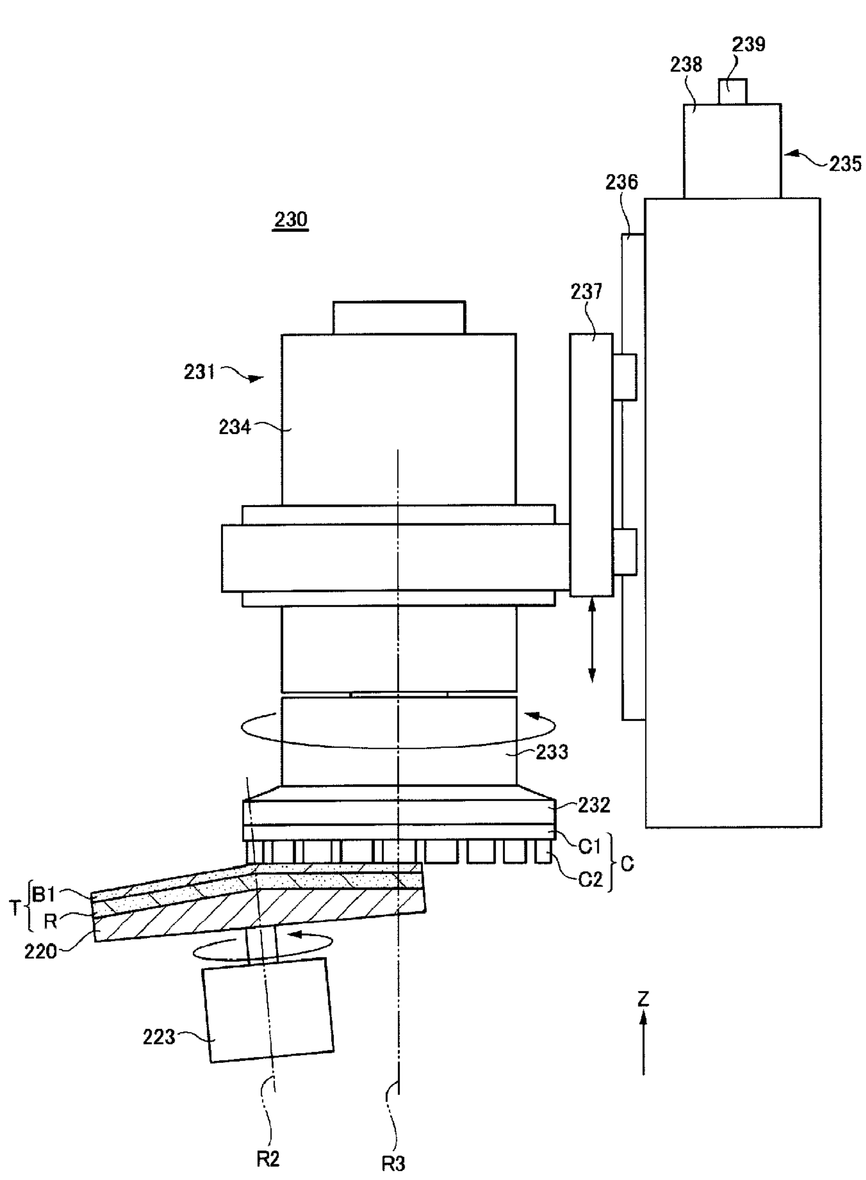
FIG. 14 is a side view illustrating an example of a grinding unit of FIG. 13.

The four chucks 220 are mounted to the rotary table 210 so as to be rotatable around their own rotation center lines R2 (see FIG. 14). At the first grinding position A1, the second grinding position A2 and the third grinding position A3, the chucks 220 are rotated about their own rotation center lines R2.

One of the grinding units 230 is configured to perform the first grinding on the base substrate B1 at the first grinding position A1. Another grinding unit 230 is configured to perform the second grinding on the base substrate B1 at the second grinding position A2. The other grinding unit 230 is configured to perform the third grinding on the based substrate B1 at the third grinding position A3.

Further, the number of the grinding units 230 may be one or more. In addition, the number of the chucks 220 needs to be larger than the number of the grinding units 230. Here, however, the rotary table 210 may be omitted. When there is no rotary table 210, the number of the chucks 220 may be equal to the number of the grinding units 230, or may be one.

Now, the grinding unit 230 will be explained with reference to FIG. 14. The grinding unit 230 includes an operating unit 231 to which a grinding tool C is attached. The grinding tool C comes into contact with the base substrate B1 to grind it. The grinding tool C includes a grinding wheel C1 having, for example, a disk shape, and a plurality of whetstones C2 arranged on a bottom surface of the grinding wheel C1 in a ring shape.

Further, although the plurality of whetstones C2 are arranged on a peripheral portion of the bottom surface of the grinding wheel C1 in the ring shape in the present exemplary embodiment, the present disclosure is not limited thereto. The whetstones C2 may be fixed to the entire bottom surface of the grinding wheel C1.

The operating unit 231 includes a flange 232 to which the grinding tool C is attached; a spindle shaft 233 having the flange 232 at a lower end thereof; and a spindle motor 234 configured to rotate the spindle shaft 233. The flange 232 is horizontally disposed, and the grinding tool C is mounted to a bottom surface thereof. The spindle shaft 233 is vertically elongated. The spindle motor 234 rotates the spindle shaft 233, thus allowing the grinding tool C attached to the flange 232 to be rotated. A rotation center line R3 of the grinding tool C is identical to a rotation center line of the spindle shaft 233.

The grinding unit 230 further includes an elevating unit 235 configured to move the operating unit 231 up and down. The elevating unit 235 includes, for example, a vertical Z-axis guide 236, a Z-axis slider 237 configured to be moved along the Z-axis guide 236, and a Z-axis motor 238 configured to move the Z-axis slider 237. The operating unit 231 is fixed to the Z-axis slider 237, and the operating unit 231 and the grinding tool C are moved up and down along with the Z-axis slider 237. The elevating unit 235 further has a position detector 239 configured to detect the position of the grinding tool C. The position detector 239 detects, for example, the rotation of the Z-axis motor 238, and detects the position of the grinding tool C.

The elevating unit 235 lowers the grinding tool C from a standby position. The grinding tool C is lowered while being rotated, and comes into contact with the top surface of the combined substrate T being rotated and grinds the entire top surface of the base substrate B1. During the grinding of the base substrate B1, a grinding liquid is supplied to the top surface of the base substrate B1. If the total thickness HT of the combined substrate T and, further, the thickness HB of the base substrate B1 reach set values, the elevating unit 235 stops the lowering of the grinding tool C. Thereafter, the elevating unit 235 raises the grinding tool C to the standby position.

Figure 16:
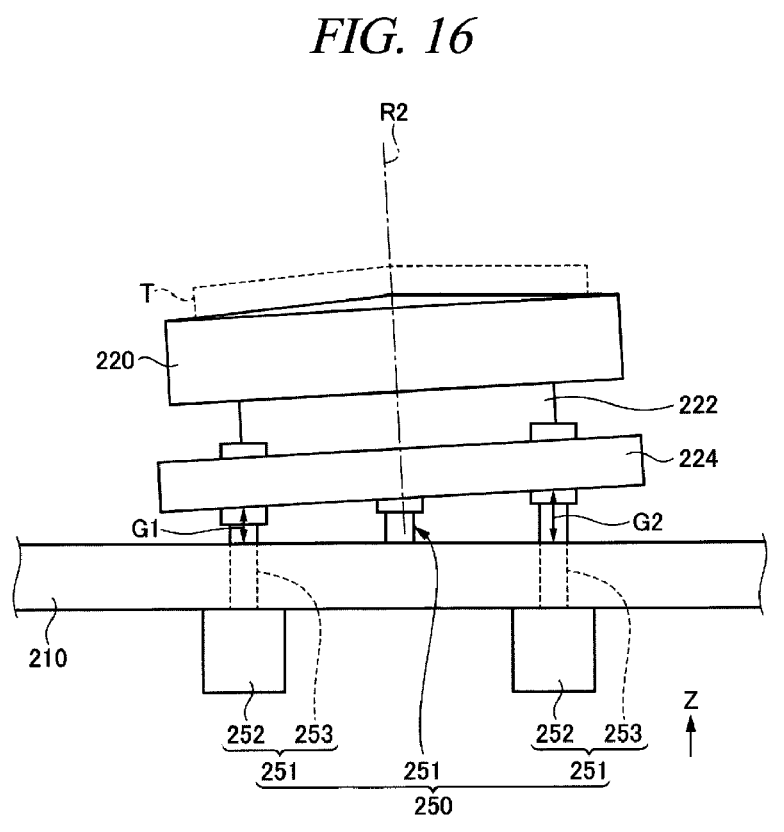

As depicted in FIG. 16, the grinding apparatus 200 is equipped with an inclination angle adjuster 250 configured to adjust an inclination angle of the rotation center line R2 of the chuck 220. The inclination angle adjuster 250 is provided at each chuck 220, and serves to adjust the inclination angle of the chuck 220.

Furthermore, the inclination angle adjuster 250 needs to adjust the inclination angle of the rotation center line R2 of the chuck 220 with respect to the rotation center line R3 of the grinding tool C, and may adjust the inclination angle of the rotation center line R3 of the grinding tool C instead of adjusting the inclination angle of the rotation center line R2 of the chuck 220.

The chuck 220 is mounted to the rotary table 210 with a support 222 and the inclination angle adjuster 250 therebetween. The support 222 is configured to rotatably support the chuck 220. A chuck motor 223 (see FIG. 14) configured to rotate the chuck 220 is embedded in the support 222, for example. The support 222 is provided with a flange 224.

The inclination angle adjuster 250 includes three connectors 251 arranged at a regular distance (e.g., at an angular interval of 120°) around the rotation center line R2 of the chuck 220. The three connectors 251 connect the flange 224 of the support 222 to the rotary table 210.

To adjust gaps G1 and G2 between the flange 224 and the rotary table 210, each of the two connectors 251 has a motor 252 and a motion transducer 253 configured to transduce a rotary movement of the motor 252 to a linear movement of the flange 224. The motion transducer 253 includes, for example, a ball screw.

The other connector 252 fixes a gap between the flange 224 of the support 222 and the rotary table 210. Here, however, the other connector 251 may also be configured to adjust the gap between the flange 224 of the support 222 and the rotary table 210.

The inclination angle adjuster 250 adjusts the inclination angle by adjusting the gaps G1 and G2. Setting of the inclination angle is performed for each of the grinding position A1, A2 and A3. As for the reason why the inclination angle is set for each of the grinding positions A1, A2 and A3, it is because the spindle shaft 233 is provided for each of the grinding positions A1, A2 and A3.

Figure 15:
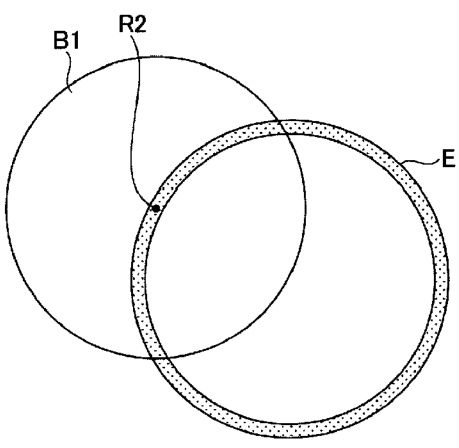
FIG. 15 is a plan view illustrating an example trajectory of a whetstone of FIG. 14.

If the inclination angle is changed, a distribution of a contact pressure between the base substrate B1 and the whetstones C2 on a trajectory E of the whetstones C2 shown in FIG. 15 is also changed. At a position where the contact pressure is high, the grinding of the base substrate B1 progresses more, as compared to a position where the contact pressure is low. Thus, by adjusting the inclination angle, a plate thickness distribution of the base substrate B1 in the diametrical direction thereof can be adjusted.

Figures 17A, 17B, 17C:
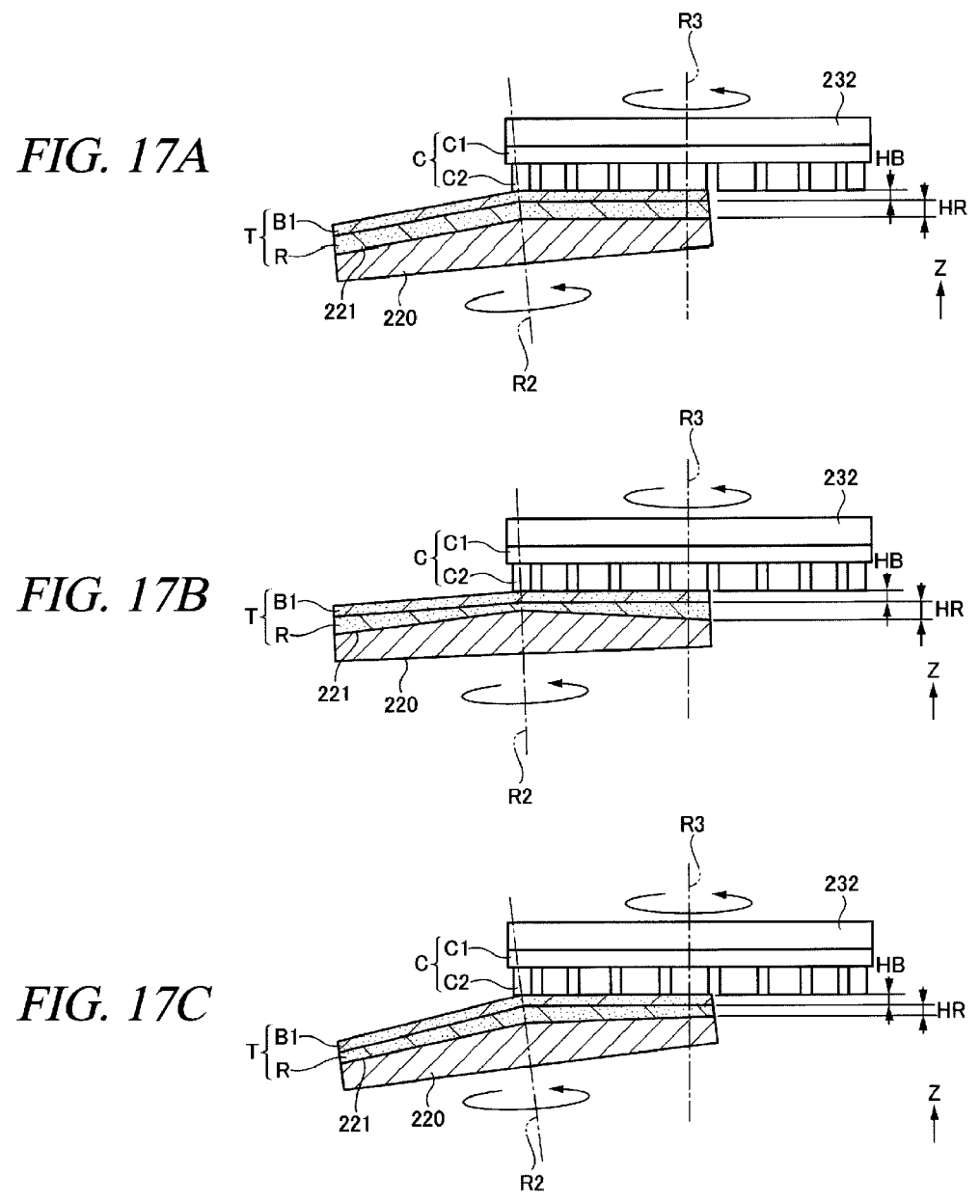

Now, referring to FIG. 17A to FIG. 17C, the adjustment of the inclination angle will be explained. The chuck 220 has a holding surface 221 on which the combined substrate T is held. The holding surface 221 holds the combined substrate T from below with the base substrate B1 facing upwards. The holding surface 221 of the chuck 220 is a conical surface symmetrical about the rotation center line R2 of the chuck 220, as shown in FIG. 17A to FIG. 17C and so forth. Since the holding surface 221 of the chuck 220 is the conical surface, it is possible to cope with various distributions of the residual thicknesses HR through the adjustment of the inclination angle.

The inclination angle is set such that the base thickness HB after the grinding becomes uniform. The inclination angle is corrected on the basis of a case where the residual thickness HR is uniform in the whole range from the center to the periphery of the combined substrate T as shown in FIG. 17A. The inclination angle as the reference is also called a reference value.

By way of example, when the residual thickness HR gradually increases from the center toward the periphery of the combined substrate T as shown in FIG. 17B, the inclination angle is corrected to be smaller than the reference value. On the other hand, when the residual thickness HR gradually decreases from the center toward the periphery of the combined substrate T as shown in FIG. 17C, the inclination angle is corrected to be larger than the reference value.

Furthermore, when the residual thickness HR gradually decreases or increases from both the center and the periphery of the combined substrate T to the midway point therebetween, the inclination angle may be adjusted such that the base thickness HB after the grinding becomes uniform.

As depicted in FIG. 13, the grinding apparatus 200 has a controller 280 configured to control the operation of the grinding apparatus 200. The controller 280 is, for example, a computer, and includes a CPU 281 and a recording medium 282 such as a memory. The recording medium 282 stores therein a program for controlling various processings performed in the grinding apparatus 200. The controller 280 controls the operation of the grinding apparatus 200 by causing the CPU 281 to execute the program stored in the recording medium 282.

As illustrated in FIG. 3, the controller 280 includes, for example, a data receiver 283, a data storage 284, and an inclination angle controller 285. The data receiver 283 receives the data of the combined substrate T at the multiple points P measured by the bonding apparatus 100. The received data includes, by way of example, the residual thickness HR and positions of the multiple points P at which the residual thickness HR is measured.

As stated above, since the bonding apparatus 100 requires the high-accuracy position control as compared to the grinding apparatus 200, it has, in the moving unit 130 and the rotating unit 131, the motor having high responsiveness to a position instruction as well as high position resolution. Instead of or in addition to such a high-performance motor, a device configured to absorb a vibration may be mounted to the bonding apparatus 100 in some cases.

In the present exemplary embodiment, since the residual thickness HR is measured by the bonding apparatus 100, it is possible to improve the position determination accuracy of the points P at which the residual thickness HR is to be measured, as compared to a case where the residual thickness HR is measured by the grinding apparatus 200. As a result, the distribution of the residual thickness HR can be calculated accurately, and the variation in the base thickness HB after the grinding can be certainly reduced.

The data storage 284 stores therein the data received by the data receiver 283. For example, the data storage 284 stores therein the residual thickness HR while matching it with the position of the point P at which this residual thickness HR is measured. If the distribution of the residual thickness HR is temporarily stored, the inclination angle can be corrected at any time.

The inclination angle controller 285 controls the inclination angle adjuster 250 based on the data received by the data receiver 283, and controls the inclination angle so that the base thickness HB after the grinding may become uniform. Thus, as stated above, the variation in the base thickness HB after the grinding can be reduced securely.

Figure 18:
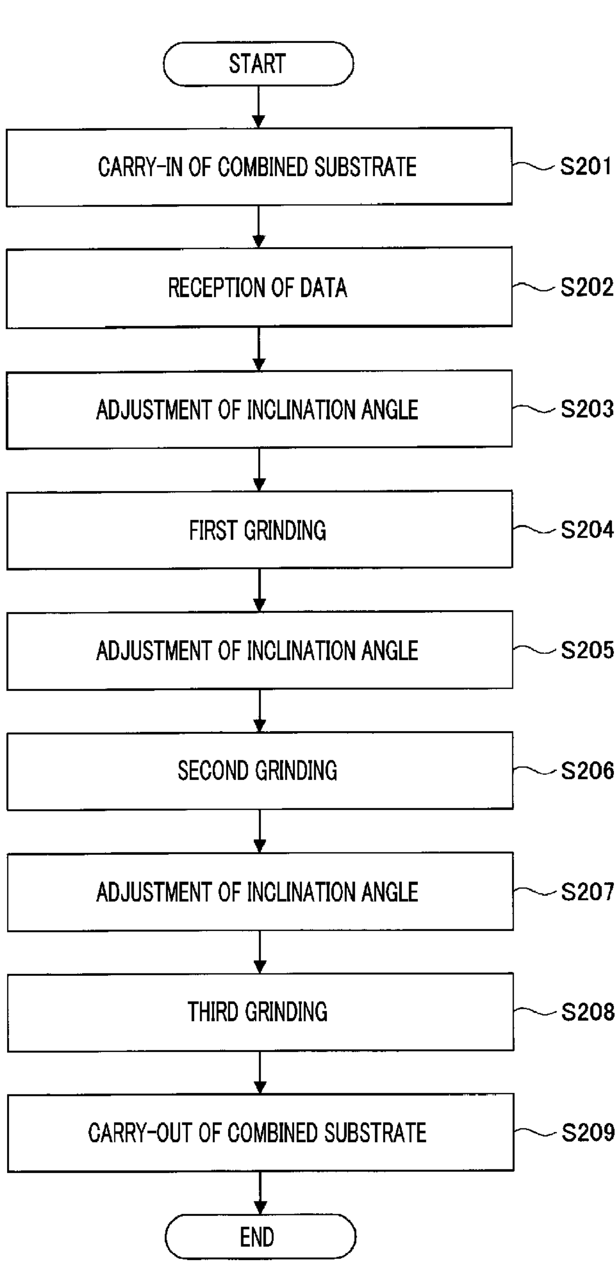
FIG. 18 is a flowchart illustrating a grinding method according to the exemplary embodiment.

Now, referring to FIG. 18, an operation of the grinding apparatus 200 will be elaborated. Further, individual processes shown in FIG. 18 are performed under the control of the controller 280 of the grinding apparatus 200.

First, in a process S201 of FIG. 18, a transfer robot 240 carries the combined substrate T onto the chuck 220. The chuck 220 receives the combined substrate T from the transfer robot 240 at the carry-in/out position A0. The chuck 220 holds the combined substrate T from below with the base substrate B1 facing upwards. Thereafter, the chuck 220 is rotated along with the rotary table 210, and is moved from the carry-in/out position A0 to the first grinding position A1.

Subsequently, in a process S202 of FIG. 18, the data receiver 283 receives the data obtained by the bonding apparatus 100. The received data includes, for example, the residual thickness HR and the positions of the multiple points P at which the residual thickness HR is measured. Here, the order of the reception of the data (process S202) and the carry-in of the combined substrate T (process S201) may be reversed. That is, the process S201 may be performed after the process S202. The process S202 only needs to be performed prior to the adjustment of the inclination angle (process S203).

Next, in the process S203 of FIG. 18, the inclination angle controller 285 controls the inclination angle adjuster 250 based on the residual thickness HR at the multiple points P, and controls the inclination angle so that the thickness HB of the base substrate B1 after the first grinding becomes uniform.

Thereafter, in a process S204 of FIG. 18, the grinding unit 230 performs the first grinding on the base substrate B1 at the first grinding position A1. Then, the chuck 220 is rotated together with the rotary table 210 and moved from the first grinding position A1 to the second grinding position A2.

Subsequently, in a process S205 of FIG. 18, the inclination angle controller 285 controls the inclination angle adjuster 250 based on the residual thickness HR at the multiple points P, and controls the inclination angle so that the thickness HB of the base substrate B1 after the second grinding becomes uniform.

Afterwards, in a process S206 of FIG. 18, the grinding unit 230 performs the second grinding on the base substrate B1 at the second grinding position A2. Then, the chuck 220 is rotated together with the rotary table 210 and moved from the second grinding position A2 to the third grinding position A3.

Next, in a process S207 of FIG. 18, the inclination angle controller 285 controls the inclination angle adjuster 250 based on the residual thickness HR at the multiple points P, and controls the inclination angle so that the thickness HB of the base substrate B1 after the third grinding becomes uniform.

Then, in a process S208 of FIG. 18, the grinding unit 230 performs the third grinding on the based substrate B1 at the third grinding position A3. Thereafter, the chuck 220 is rotated together with the rotary table 210 and moved from the third grinding position A3 to the carry-in/out position A0.

Finally, in a process S209 of FIG. 18, the chuck 220 releases the holding of the combined substrate T, the transfer robot 240 receives the combined substrate T from the chuck 220 and carries the received combined substrate T to the outside of the grinding apparatus 200. Further, before the combined substrate T is carried out, the base thickness HB after the third grinding is measured at multiple points at the carry-in/out position A0 or the third grinding position A3. When the variation of the base thickness HB after the third grinding is equal to or larger than a threshold value, a correction value of the inclination angle for making the variation less than the threshold value is calculated. The correction value is added to the correction of the inclination angle in the third grinding next time.

Figure 19:
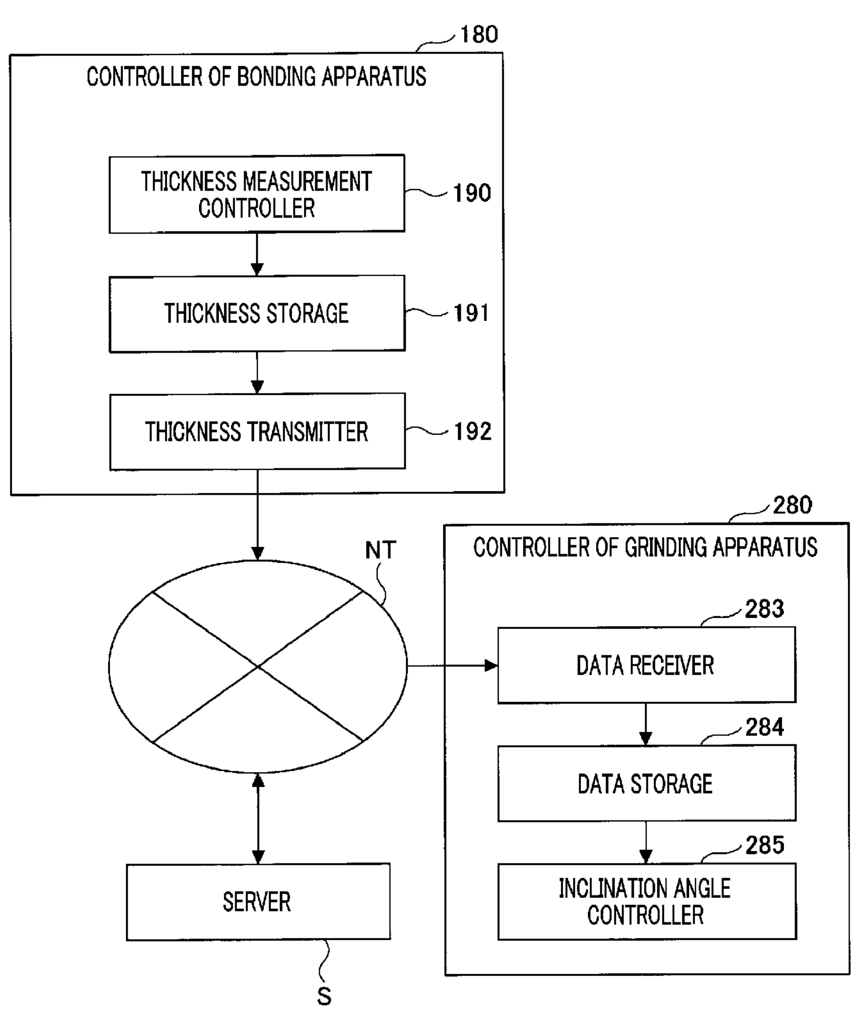
FIG. 19 is a functional block diagram illustrating a configuration of a controller of a bonding apparatus and a controller of a grinding apparatus according to a first modification example.

Now, with reference to FIG. 19, a configuration of the controller 180 of the bonding apparatus 100 and the controller 280 of the grinding apparatus 200 according to a first modification example will be described. In the following, components identical to those shown in FIG. 3 will be assigned same reference numerals, and redundant description thereof will be omitted. In the present modification example, instead of measuring the thickness HR of the remainder R, a thickness HA of the second substrate W2 is measured.

As shown in FIG. 1A, the thickness HR of the remainder R is equal to the sum of the thickness HA of the second substrate W2, a thickness of the device layer D1, and a thickness of the bonding layer F1. When the thickness of the device layer D1 and the thickness of the bonding layer F1 are uniform, a variation of the residual thickness HR of the remainder R is equal to the variation of the thickness HA of the second substrate W2. In this case, the thickness HA of the second substrate W2 may correspond to the thickness HR of the remainder R.

If the thickness HA of the second substrate W2 corresponds to the thickness HR of the remainder R, the thickness detector 152 configured to measure the base thickness HB is no more required. However, in case of measuring the residual thickness HR by calculating the difference between the total thickness HT and the base thickness HB, it is possible to reduce the variation in the base thickness HB after the grinding more securely, as compared to a case where the thickness HA is measured instead of the residual thickness HR.

The controller 180 of the bonding apparatus 100 according to the present modification example has a thickness measurement controller 190, a thickness storage 191, and a thickness transmitter 192. The thickness measurement controller 190 controls the thickness detector 151 to measure the thickness HA of the second substrate W2 at the multiple points P. A method of measuring the thickness HA will be elaborated later.

The thickness storage 191 stores therein the data obtained by the thickness measurement controller 190. For example, the thickness storage 191 stores the thickness HA while matching it with the position of the point P at which the thickness HA is measured. If the data such as the thickness HA is temporarily stored, the data such as the thickness HA can be transmitted at any time.

The thickness transmitter 192 transmits the data obtained by the thickness measurement controller 190 to the outside of the bonding apparatus 100. For example, the thickness transmitter 192 sends the grinding apparatus 200 the data including the thickness HA and the positions of the multiple points P at which the thickness HA is measured. The thickness transmitter 192 may transmit the data such as the thickness HA to the grinding apparatus 200 via the server S.

Now, with reference to FIG. 20, a bonding method according to the first modification example will be discussed. In the following, processes identical to those of the bonding method shown in FIG. 6 will be assigned same reference numerals, and redundant description thereof will be omitted.

Figure 20:
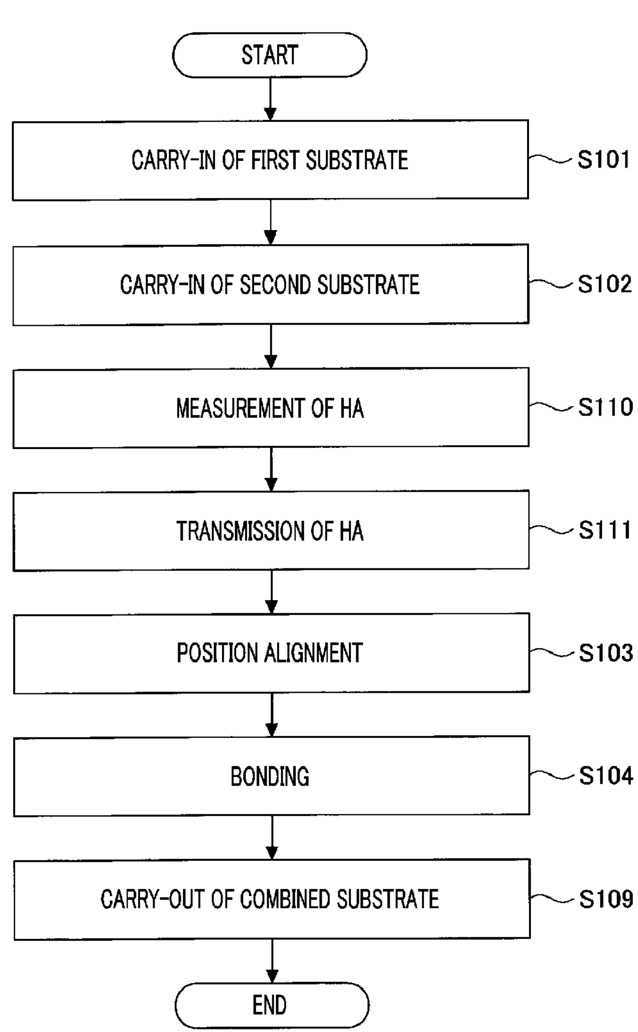
FIG. 20 is a flowchart illustrating a grinding method according to the first modification example.

In a process S110 of FIG. 20, the thickness measurement controller 190 controls the thickness detector 151 to measure the thickness HA of the second substrate W2 at the multiple points P. Further, the thickness measurement controller 190 controls the moving unit 130 or the rotating unit 131 to control the positions of the points P at which the thickness HA is measured by the thickness detector 151. The thickness HA of the second substrate W2 is measured before the bonding process S104. The thickness HA of the second substrate W2 is useful when the thickness of the device layer D1 and the thickness of the bonding layer F1 are uniform. The thickness HA of the second substrate W2 is used in adjusting the inclination angle of the rotation center line R2 of the chuck 220 in the grinding apparatus 200, for example.

In the present modification example, since the thickness HA is measured in the bonding apparatus 100, the position determination accuracy of the points P at which the thickness HA is measured can be improved, as compared to a case where thickness HA is measured in the grinding apparatus 200. As a result, a distribution of the thickness HA can be accurately calculated, and the variation in the base thickness HB after the grinding can be reliably reduced.

Figure 21A:
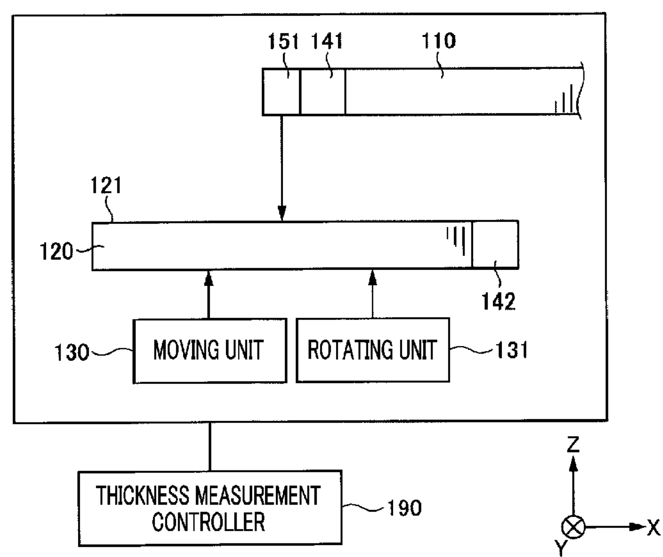
FIG. 21A is a side view illustrating an example of position measurement of the top surface of the second holder.

The method of measuring the thickness HA is the same as the method of measuring the total thickness HT. By way of example, as shown in FIG. 21A, the thickness measurement controller 190 previously measures the height of the holding surface 121 of the second holder 120 at the multiple points P in the state that the holding surface 121 is exposed.

The height measurement of the holding surface 121 is performed before the carry-in (process S102) of the second substrate W2. Further, the height measurement of the holding surface 121 may be performed after the carry-out (process S109) of the combined substrate T. With the holding surface 121 exposed, it is possible to measure the height of the holding surface 121.

Figure 21B:
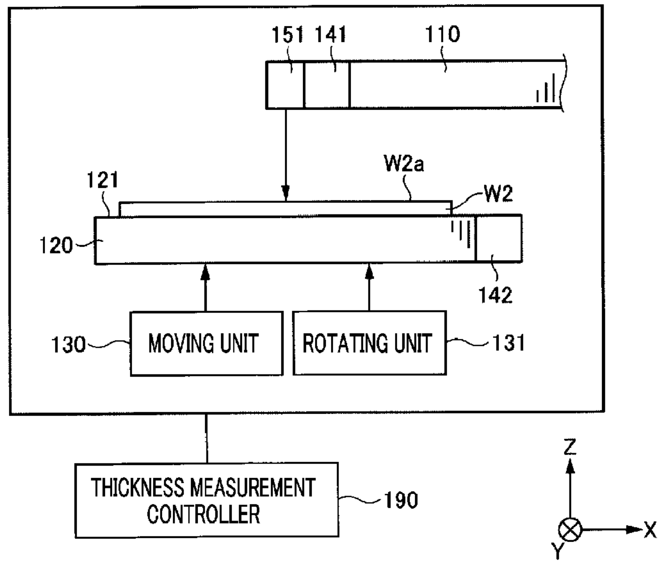
FIG. 21B is a side view illustrating an example of position measurement of a top surface of a second substrate.

Moreover, as shown in FIG. 21B, the thickness measurement controller 190 measures the height of the bonding surface W2*a* of the second substrate W2 at the multiple points P in the state that the second substrate W2 is held on the holding surface 121 of the second holder 120. The bonding surface W2*a* of the second substrate W2 is opposite to (for example, above) a non-bonding surface thereof in contact with the second holder 120. The height of the bonding surface W2*a* of the second substrate W2 and the height of the holding surface 121 of the second holder 120 are measured at the same multiple points P. The points P where the height of the bonding surface W2*a* of the second substrate W2 is measured and the points P where the height of the holding surface 121 of the second holder 120 is measured are the same points when viewed from the vertical direction.

In measuring the height of the bonding surface W2*a* of the second substrate W2 and in measuring the height of the holding surface 121 of the second holder 120, the second holder 120 may be controlled to the same positions in the X-axis direction, the Y-axis direction and the Z-axis direction. In this case, a difference between the height of the bonding surface W2*a* of the second substrate W2 and the height of the holding surface 121 of the second holder 120 is equal to the thickness HA of the second substrate W2. Here, however, instead of the configuration in which the second holder 120 is moved, the thickness detector 151 may be moved, or both of them may be moved. The measurement of the height of the holding surface 121 of the second holder 120 and the measurement of the height of the bonding surface W2*a* of the second substrate W2 need to be performed in the state that the relative positions (the positions in the X-axis direction, the Y-axis direction, and the Z-axis direction) of the second holder 120 and the thickness detector 151 are the same. In this case, the difference between the height of the bonding surface W2*a* of the second substrate W2 and the height of the holding surface 121 of the second holder 120 is equal to the thickness HA of the second substrate W2.

The thickness measurement controller 190 calculates the difference between the height of the bonding surface W2*a* of the second substrate W2 and the height of the holding surface 121 of the second holder 120 at the multiple points P, and calculates the thickness HA of the second substrate W2 at the multiple points. These calculations may be performed after the carry-out (process S109) of the combined substrate T.

According to the present modification example, the difference between the height of the bonding surface W2*a* of the second substrate W2 and the height of the holding surface 121 of the second holder 120 is calculated at the same points P when viewed from the vertical direction. Therefore, even when the thickness HA of the second substrate W2 is non-uniform, the thickness HA can still be accurately measured. As compared to a case where the difference between the height of the bonding surface W2*a* of the second substrate W2 and the height of the holding surface 121 of the second holder 120 is calculated at different points, the distribution of the thickness HA of the second substrate W2 can be measured accurately.

The thickness storage 191 stores therein the thickness HA measured by the thickness measurement controller 190 while matching it with the position of the point P at which the thickness HA is measured. The positions of the multiple points P may be stored with reference to the position of the notch indicating the crystal orientation of the second substrate W2.

In addition, in measuring the height of the bonding surface W2*a* of the second substrate W2 and in measuring the height of the holding surface 121 of the second holder 120, the second holder 120 needs to be controlled to the same positions in the X-axis direction and the Y-axis direction, and the second holder 120 may be displaced in the Z-axis direction. In this case, the thickness HA of the second substrate W2 is calculated in consideration of the displacement amount in the Z-axis direction of the second holder 120 as well. Here, however, instead of the configuration in which the second holder 120 is moved in the X-axis direction and the Y-axis direction, the thickness detector 151 may be moved in the X-axis direction and the Y-axis direction, or either one of the second holder 120 and the thickness detector 151 may be moved in the X-axis direction while the other may be move in the Y-axis direction. The height measurement of the holding surface 121 of the second holder 120 and the height measurement of the bonding surface W2*a* of the second substrate W2 need to be performed in the state that the relative positions (the positions in the X-axis direction and the Y-axis direction) of the second holder 120 and the thickness detector 151 when viewed from the Z-axis direction are the same.

In addition, the measurement of the thickness HA may be performed by the focusing of the camera, the same as in the measurement of the total thickness HT.

Next, in a process S111 of FIG. 20, the thickness transmitter 192 transmits, to the outside of the bonding apparatus 100, data such as the thickness HA and the positions of the multiple points P at which the thickness HA is measured. For example, the thickness transmitter 192 transmits the data such as the thickness HA to the grinding apparatus 200. The thickness transmitter 192 may transmit the data such as the thickness HA to the grinding apparatus 200 via the server S. In addition, this transmission needs to be performed after the measurement of the thickness HA (process S110), and it may be performed after the carry-out (process S109) of the combined substrate T.

Figure 22:
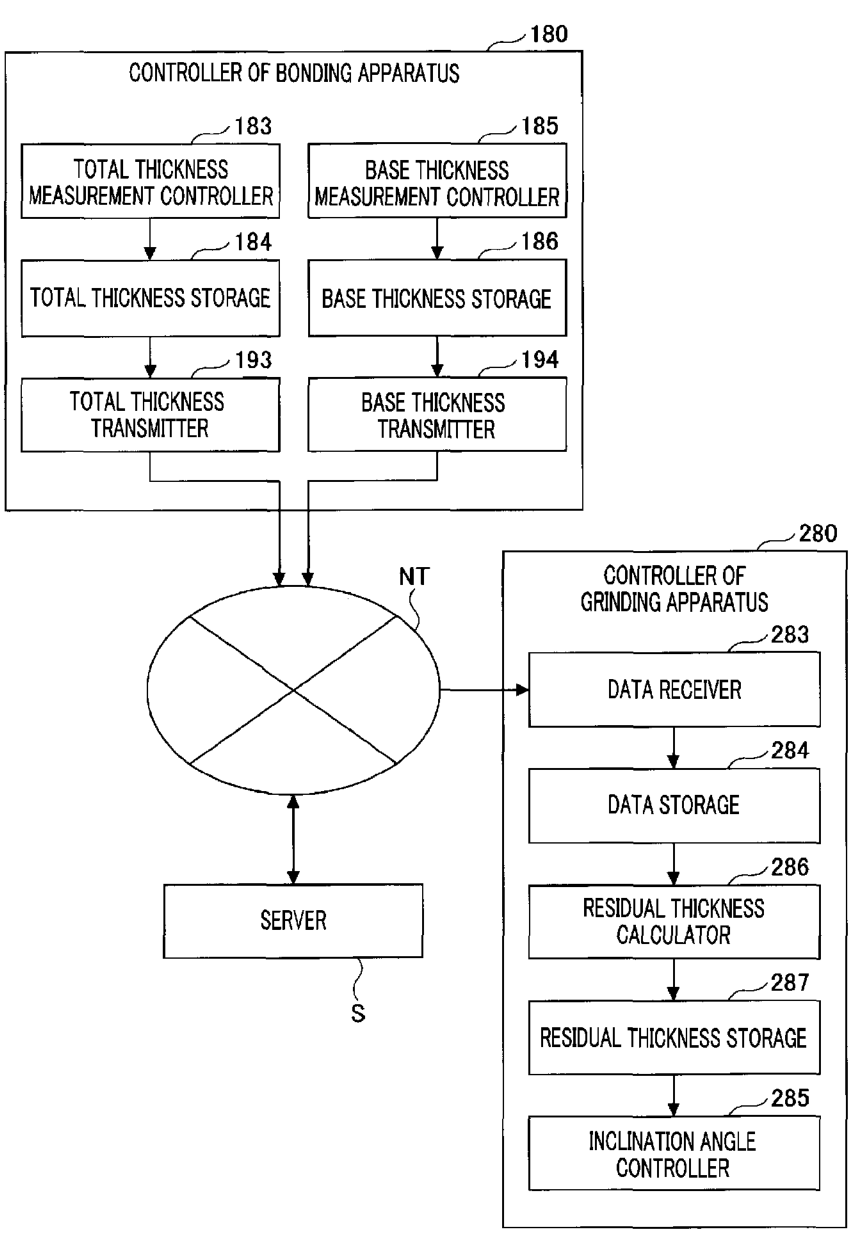
FIG. 22 is a functional block diagram illustrating components of a controller of a bonding apparatus and a controller of a grinding apparatus according to a second modification example.

Next, with reference to FIG. 22, a configuration of the controller 180 of the bonding apparatus 100 and the controller 280 of the grinding apparatus 200 according to a second modification example will be described. In the following, components identical to those described in FIG. 3 will be assigned same reference numerals, and redundant description thereof will be omitted. In the present modification example, instead of calculating the residual thickness HR of the remainder R in the bonding apparatus 100, the residual thickness HR is calculated in the grinding apparatus 200.

The controller 180 of the bonding apparatus 100 according to the present modification example includes a total thickness transmitter 193 and a base thickness transmitter 194. The total thickness transmitter 193 transmits the data measured by the total thickness measurement controller 183 to the outside of the bonding apparatus 100. For example, the total thickness transmitter 193 sends the grinding apparatus 200 the data including the total thickness HT and the positions of the multiple points P at which the total thickness HT is measured. The total thickness transmitter 193 may transmit the data, such as the total thickness HT, to the grinding apparatus 200 via the server S.

The base thickness transmitter 194 transmits the data measured by the base thickness measurement controller 185 to the outside of the bonding apparatus 100. By way of example, the base thickness transmitter 194 sends the grinding apparatus 200 the data including the base thickness HB and the positions of the multiple points P at which the base thickness HB is measured. The base thickness transmitter 194 may transmit the data, such as the base thickness HB, to the grinding apparatus 200 via the server S.

Meanwhile, the controller 280 of the grinding apparatus 200 of the present modification example includes a residual thickness calculator 286 and a residual thickness storage 287 in addition to the data receiver 283, the data storage 284 and the inclination angle controller 285. By way of example, the data received by the data receiver 283 includes both the total thickness HT and the base thickness HB as well as the positions of the multiple points P at which these thicknesses HT and HB are measured. The points P at which the total thickness HT is measured and the points P at which the base thickness HB is measured are the same.

The residual thickness calculator 286 calculates the residual thickness HR at the multiple points P from the data received by the data receiver 283. The residual thickness calculator 286 calculates a difference between the total thickness HT and the base thickness HB at each of the multiple points P to calculate the residual thickness HR. The residual thickness calculator 286 may calculate an average value of the residual thickness HR for each distance from the center of the combined substrate T.

The residual thickness storage 287 stores therein the data calculated by the residual thickness calculator 286. For example, the residual thickness storage 287 stores the residual thickness HR while matching it with the position of the point P at which the residual thickness HR is measured. If the data such as the residual thickness HR is temporarily stored, the inclination angle controller 285 can carry out the control over the inclination angle at an appropriate timing.

According to the present modification example, the measurement of the distribution of the total thickness HT and the measurement of the distribution of the base thickness HB are not performed in the grinding apparatus 200 but in the bonding apparatus 100, the same as in the above-described exemplary embodiment. Thus, it is possible to improve the position determination accuracy of the points P where the total thickness HT is measured and the points P where the base thickness HB is measured. As a result, the distribution of the residual thickness HR can be calculated accurately, and the variation in the base thickness HB after the grinding can be reduced securely.

Figure 23:
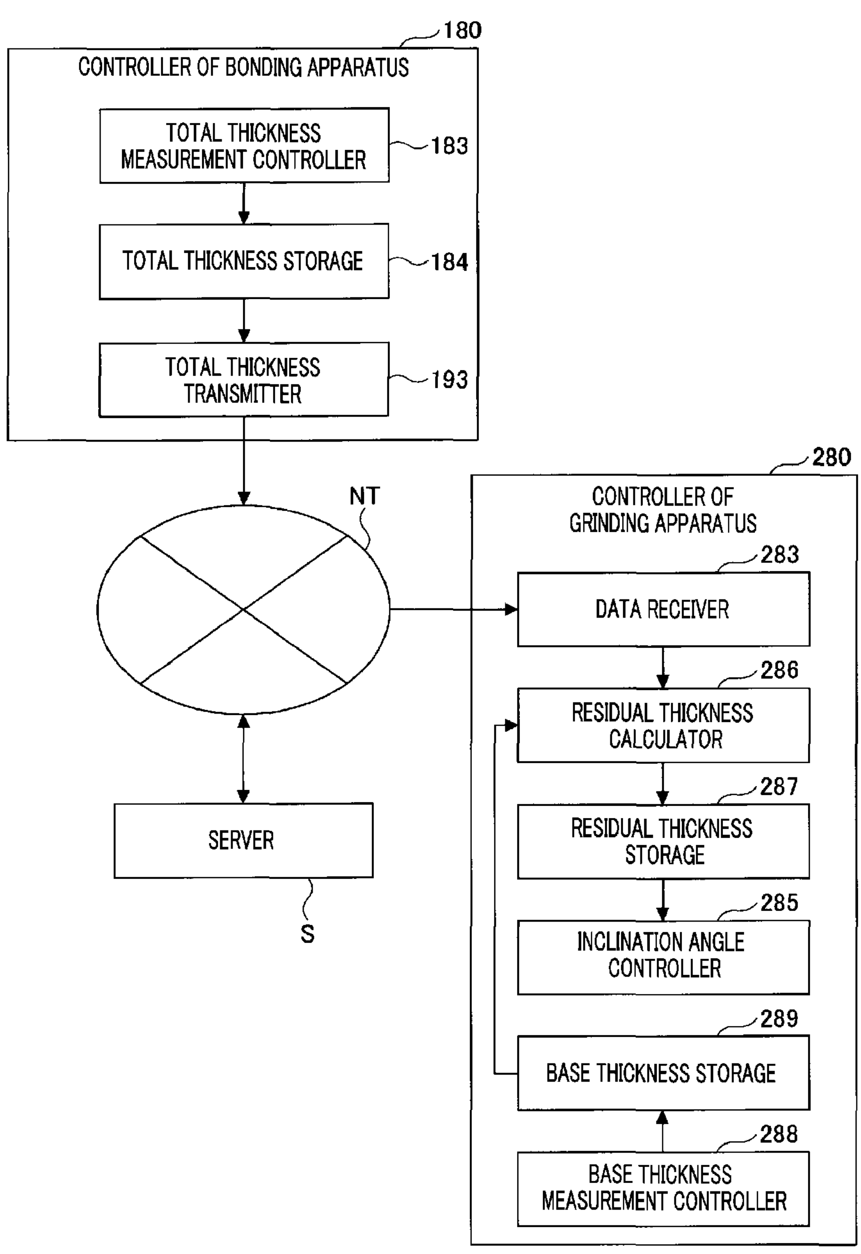
FIG. 23 is a functional block diagram illustrating components of a controller of a bonding apparatus and a controller of a grinding apparatus according to a third modification example.

Now, with reference to FIG. 23, a configuration of the controller 180 of the bonding apparatus 100 and the controller 280 of the grinding apparatus 200 according to a third modification example will be explained. In the following, components identical to those described in FIG. 22 will be assigned same reference numerals, and redundant description thereof will be omitted. In the present modification example, instead of measuring the base thickness HB in the bonding apparatus 100, the base thickness HB is measured in the grinding apparatus 200.

The controller 280 of the grinding apparatus 200 of the present modification example includes a base thickness measurement controller 288 and a base thickness storage 289. The base thickness measurement controller 288 controls a thickness detector 261 shown in FIG. 24 to measure the base thickness HB at the multiple points P. Further, the base thickness measurement controller 288 controls a moving unit configured to move the thickness detector 261 in the diametrical direction of the combined substrate T to control the positions of the points P at which the base thickness HB is measured. It is also possible to control the positions of the points P at which the base thickness HB is measured, by controlling the rotation of the chuck 220. The points P at which the base thickness HB is measured and the points P at which the total thickness HT is measured are the same points within the surface of the combined substrate T. By calculating the difference between the total thickness HT and the base thickness HB measured at the same point P within the surface of the combined substrate T, the residual thickness HR can be measured accurately.

Figure 24:
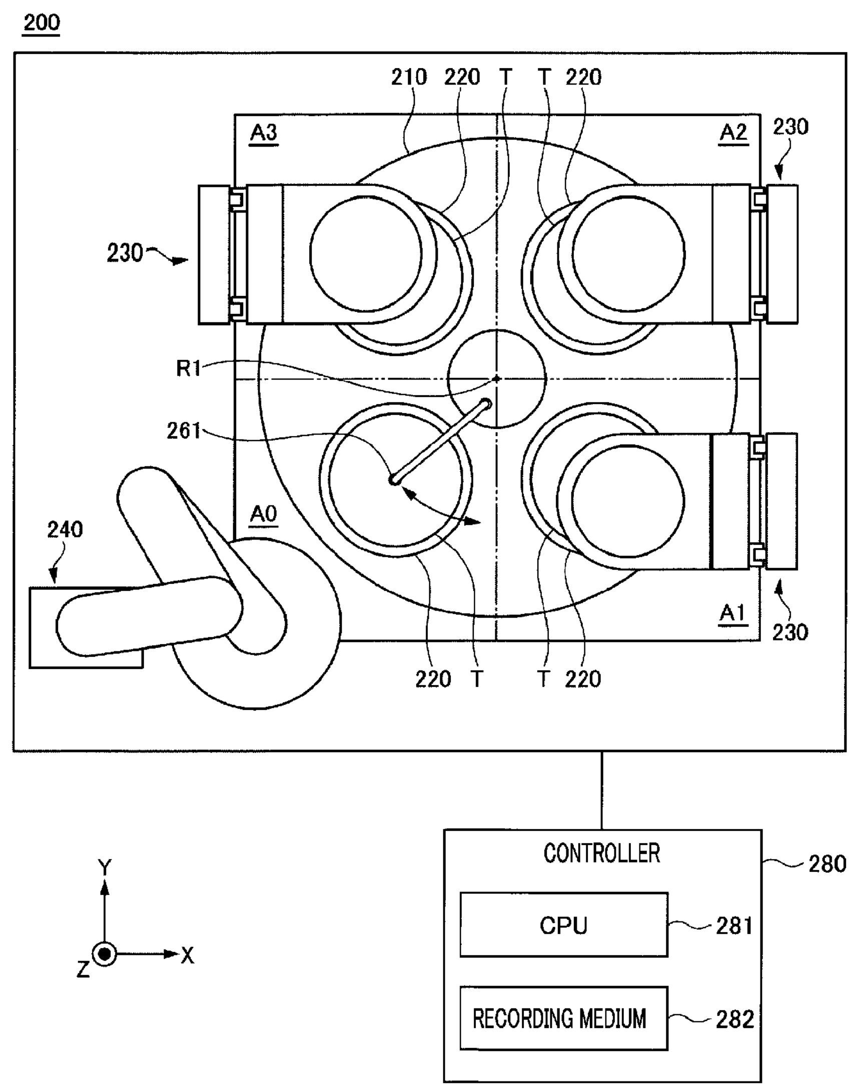
FIG. 24 is a plan view illustrating the grinding apparatus according to the third modification example.

As depicted in FIG. 24, the thickness detector 261 measures the base thickness HB at the carry-in/out position A0, for example. The thickness detector 261 is movable in the diametrical direction of the combined substrate T, as mentioned above. The base thickness HB can be measured at multiple points in the diametrical direction of the combined substrate T. Although only one thickness detector 261 is provided in the present modification example, more than one thickness detector may be provided. In view of the fact that the number of the points P at which the base thickness HB is measured is plural, the time required for the measurement can be reduced if the number of the thickness detectors 261 increases.

In addition, the installation position of the thickness detector 261 is not limited to the carry-in/out position A0, but it may be the first grinding position A1. In this case as well, before the first grinding, the base thickness HB can be measured, so that the residual thickness HR can be calculated. Therefore, it is possible to control the inclination angle so that the thickness HB of the base substrate B1 after the first grinding becomes uniform.

However, as long as the thickness HB of the base substrate B1 after the third grinding is uniform, the installation position of the thickness detector 261 may be the second grinding position A2 or the third grinding position A3.

The base thickness storage 289 stores therein the data measured by the base thickness measurement controller 288. By way of example, the base thickness storage 289 stores the base thickness HB while matching it with the position of the point P at which the base thickness HB is measured. If the data such as the base thickness HB is temporarily stored, the calculation of the residual thickness HR can be performed at any time.

The residual thickness calculator 286 calculates the residual thickness HR at the multiple points P from the data received by the data receiver 283 and the data measured by the base thickness measurement controller 288. The residual thickness calculator 286 calculates a difference between the total thickness HT and the base thickness HB at each of the multiple points P to calculate the residual thickness HR. The residual thickness calculator 286 may calculate an average value of the residual thickness HR for each distance from the center of the combined substrate T.

According to the present modification example, the measurement of the distribution of total thickness HT is not performed in the grinding apparatus 200 but in the bonding apparatus 100, the same as in the above-described exemplary embodiment. Thus, the position determination accuracy of the points P where the total thickness HT is measured can be improved. The total thickness HT can be measured at the required points P, and the total thickness HT and the base thickness HB can be measured at the same points P within the surface of the combined substrate T. As a result, the distribution of the residual thickness HR can be calculated accurately, and the variation in the base thickness HB after the grinding can be reduced securely.

So far, the exemplary embodiment of the bonding apparatus and the bonding method according to the present disclosure have been described. However, the present disclosure is not limited to the above-described exemplary embodiment and the like. Various changes, modifications, substitutions, additions, deletions and combinations may be made within the scope of the claims, which are all incorporated within a technical scope of the present disclosure.

This application claims priority to Japanese Patent Application No. 2020-011926, field on Jan. 28, 2020, which application is hereby incorporated by reference in their entirety.

According to the exemplary embodiments, when measuring the total thickness of the combined substrate including the first substrate and the second substrate bonded to the first substrate, it is possible to improve the position determination accuracy of the points at which the total thickness is measured.

We claim:

1. A bonding apparatus configured to prepare a combined substrate by bonding a first substrate and a second substrate, wherein the first substrate comprises a base substrate, and a device layer formed on a surface of the base substrate facing the second substrate, wherein the bonding apparatus comprises:

a first holder configured to hold the first substrate;

a second holder configured to hold the second substrate;

a moving unit configured to move the first holder and the second holder relative to each other; and a controller configured to:

control the first holder and the second holder to bond the first substrate and the second substrate to form the combined substrate within the bonding apparatus, after the controlling of the first holder and the second holder to bond the first substrate and the second substrate to form the combined substrate within the bonding apparatus, control a thickness detector, which is configured to measure a total thickness of the combined substrate, to measure the total thickness at multiple points within the bonding apparatus, wherein the thickness detector is fixed to a side surface of the first holder other than a holding surface of the first holder, or a side surface of the second holder other than a holding surface of the second holder, and wherein the controller controls the moving unit to change a measurement point of the thickness detector among the multiple points.

2. The bonding apparatus of claim 1, further comprising:

a total thickness storage configured to store therein data measured by the controller.

3. The bonding apparatus of claim 1, further comprising: a base thickness measurement controller configured to control a thickness detector, which is configured to measure a thickness of the base substrate, to measure the thickness of the base substrate at the multiple points.

4. The bonding apparatus of claim 3, further comprising: a residual thickness calculator configured to calculate a thickness of a remainder of the combined substrate except the base substrate at the multiple points from the data measured by the controller and data measured by the base thickness measurement controller.

5. The bonding apparatus of claim 4, further comprising: a residual thickness transmitter configured to transmit data calculated by the residual thickness calculator to an outside of the bonding apparatus.

6. The bonding apparatus of claim 5, wherein the residual thickness transmitter transmits the data calculated by the residual thickness calculator to a grinding apparatus configured to grind the base substrate.

7. The bonding apparatus of claim 6, wherein the residual thickness transmitter transmits the data calculated by the residual thickness calculator to the grinding apparatus via a server.

8. The bonding apparatus of claim 3, further comprising: a base thickness transmitter configured to transmit data measured by the base thickness measurement controller to an outside of the bonding apparatus.

9. The bonding apparatus of claim 1, further comprising: a total thickness transmitter configured to transmit data measured by the controller to an outside of the bonding apparatus.

10. The bonding apparatus of claim 1, wherein the thickness detector configured to measure the total thickness comprises a laser displacement meter.

11. The bonding apparatus of claim 1, wherein the thickness detector configured to measure the total thickness comprises a camera, and the controller measures the total thickness by focusing of the camera.

12. The bonding apparatus of claim 1, wherein the second holder or the first holder has a holding surface configured to hold thereon the combined substrate, wherein the controller performs:

measuring, at the multiple points, a position of the holding surface in a direction orthogonal to the holding surface in a state that the holding surface is exposed;

measuring, at the multiple points, a position of a surface of the combined substrate in the direction orthogonal to the holding surface in a state that the combined substrate is held on the holding surface; and calculating, at the multiple points, the total thickness from a difference between the position of the holding surface and the position of the surface of the combined substrate in the direction orthogonal to the holding surface.

13. The bonding apparatus of claim 12, wherein the second holder or the first holder includes, on the holding surface, a suction hole configured to suck the combined substrate, and the multiple points are disposed on the holding surface to be located at positions that are not overlapped with the suction hole.

14. The bonding apparatus of claim 13, wherein the second holder or the first holder includes a rib forming a flat surface on the holding surface, and the multiple points lie on the flat surface of the rib.

15. The bonding apparatus of claim 14, wherein at least a portion of the flat surface of the rib is formed in a straight line shape or an annular shape.

16. The bonding apparatus of claim 1, wherein the second holder or the first holder includes a rib forming a flat surface on the holding surface, wherein the multiple points lie on the flat surface of the rib, wherein at least a portion of the flat surface of the rib is formed in an annular shape, and wherein the bonding apparatus further comprises a rotating unit configured to rotate the holding surface.

17. A bonding method of preparing a combined substrate by bonding a first substrate and a second substrate by using a bonding apparatus, wherein the first substrate comprises a base substrate, and a device layer formed on a surface of the base substrate facing the second substrate, wherein the bonding method comprises:

holding the first substrate with a first holder;

holding the second substrate with a second holder;

controlling a moving unit configured to move the first holder and the second holder relative to each other to align the first substrate and the second substrate;

controlling the first holder and the second holder to bond the first substrate and the second substrate to form the combined substrate within the bonding apparatus;

after bonding of the first substrate and the second substrate, measuring a total thickness of the combined substrate at multiple points within the bonding apparatus; and measuring a thickness of the base substrate at the multiple points, wherein the thickness of the base substrate is measured by a thickness detector that radiates light from above the base substrate, and measures the thickness of the base substrate from a phase difference between the light reflected from a top surface of the base substrate and the light reflected from the bottom surface of the base substrate, and wherein the thickness detector is fixed to a side surface of the first holder other than a holding surface of the first holder, or a side surface of the second holder other than a holding surface of the second holder.

18. The bonding method of claim 17, wherein the thickness of the base substrate at the multiple points is measured in a state that the combined substrate is held by the second holder or the first holder.

19. The bonding method of claim 18, further comprising: calculating a thickness of a remainder of the combined substrate except the base substrate by calculating, at each of the multiple points, a difference between the total thickness of the combined substrate and the thickness of the base substrate.

20. The bonding apparatus of claim 1, wherein the thickness detector is configured to:

measure, at the multiple points, a position of a holding surface of the second holder holding the combined substrate after bonding; and measure, at the multiple points, a position of a surface of the combined substrate opposite to the holding surface of the second holder while the combined substrate is held by the second holder, and wherein the controller is configured to set the total thickness of the combined substrate as a difference between the measured position of the surface of the combined substrate opposite to the holding surface and the measured position of the holding surface.

21. The bonding apparatus of claim 20, wherein the thickness detector configured to measure the total thickness comprises a laser displacement meter, and wherein the thickness detector is further configured to measure a distance to the holding surface from the laser displace meter.

22. The bonding apparatus of claim 20, wherein the thickness detector configured to measure the total thickness comprises a camera, wherein the controller measures the total thickness by focusing of the camera, wherein the controller is configured to:

focus the camera on the holding surface of the second holder in a state that the holding surface is exposed and store a height position of the second holder at the time of the focusing;

focus the camera on the surface of the combined substrate opposite to the holding surface in a state that the combined substrate is held by the second holder and store a height position of the second holder at the time of the focusing; and calculate the total thickness of the combined substrate based on a shift amount between the stored positions, and wherein the focusing of the camera includes moving the first holder or moving the second holder.

* * * * *